(12) United States Patent
Ogata

(10) Patent No.: US 7,456,659 B2
(45) Date of Patent: Nov. 25, 2008

(54) SEMICONDUCTOR INTEGRATED CIRCUIT

(75) Inventor: Hiromi Ogata, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/808,976

(22) Filed: Jun. 14, 2007

(65) Prior Publication Data

US 2007/0241779 A1     Oct. 18, 2007

Related U.S. Application Data

(63) Continuation of application No. 11/070,205, filed on Mar. 3, 2005, now Pat. No. 7,274,210.

(30) Foreign Application Priority Data

Mar. 10, 2004   (JP)   ............... P2004-067489

(51) Int. Cl.
*H03K 19/00*   (2006.01)
(52) U.S. Cl. ...................... 326/101; 257/207
(58) Field of Classification Search ............ 326/37–46, 326/26, 27, 100–103, 93–98, 112, 119; 257/202, 257/207, 690, 691
See application file for complete search history.

(56) References Cited

U.S. PATENT DOCUMENTS

| | | | | |
|---|---|---|---|---|
| 5,615,162 | A * | 3/1997 | Houston | ............... 365/226 |
| 6,169,419 | B1 * | 1/2001 | De et al. | ............... 326/58 |
| 6,239,614 | B1 * | 5/2001 | Morikawa | ............... 326/39 |
| 6,433,584 | B1 | 8/2002 | Hatae | |
| 6,501,300 | B2 * | 12/2002 | Hatae | ............... 326/93 |
| 6,989,686 | B2 | 1/2006 | Arakawa | |
| 7,253,662 | B2 * | 8/2007 | Tsai et al. | ............... 326/101 |

FOREIGN PATENT DOCUMENTS

| | | |
|---|---|---|
| JP | 05-206420 | 8/1993 |
| JP | 07-245347 | 9/1995 |
| JP | 2001-298090 | 10/2001 |
| JP | 2003-158189 | 5/2003 |

OTHER PUBLICATIONS

Japanese Office Action for patent application No. JP 2004-067489 issued on Aug. 7, 2007.

* cited by examiner

*Primary Examiner*—Don P Le
(74) *Attorney, Agent, or Firm*—Rader Fishman & Grauer PLLC; Ronald P. Kananen

(57) ABSTRACT

A semiconductor integrated circuit able to reduce a load of layout design when arranging switches in a power lines for preventing leakage current and able to reduce the influence of a voltage drop occurring in the switches on a signal delay, wherein a plurality of groups of power lines are arranged in stripe shapes, power is supplied to circuit cells by a plurality of groups of branch lines branching from the groups of power lines, power switch cells arranged in the groups of branch lines turn on or off the supply of power to the circuit cells, the power switch cells are arranged dispersed in the area of arrangement of the circuit cells, and the supply of power by the power switch cells is finely controlled for every relatively small number of circuit cells.

8 Claims, 17 Drawing Sheets

11

21

12

13

SEMICONDUCTOR INTEGRATED CIRCUIT

CROSS REFERENCES TO RELATED APPLICATION

This is a continuation of application Ser. No. 11/070,205, filed Mar. 3, 2005, the entire contents of which is hereby incorporated by reference.

The present invention contains subject matter related to Japanese Patent Application JP 2004-067489 filed in the Japanese Patent Office on Mar. 10, 2004, the entire contents of which is also incorporated herein by reference.

BACKGROUND OF THE INVENTION

1. Field of the Invention

The present invention relates to a semiconductor integrated circuit, and, more particularly, to a semiconductor integrated circuit achieving a reduction of power consumption by using a transistor having a high threshold voltage to cut the supply of power to an unused circuit.

2. Background Art

The power supply voltage of semiconductor integrated circuits has fallen year by year along with the reduction of power consumption and the miniaturization of processing dimensions. When a signal amplitude becomes small due to the reduction of the power supply voltage, the threshold voltage of a transistor becomes high relative to the signal amplitude, so an on current of the transistor decreases and a delay increases. For this reason, the threshold voltage of the transistor also must be made lower along with the power supply voltage. However, a leakage current in an off state increases when the threshold voltage of the transistor is lowered, so there is the disadvantage that reduction of the power consumption is obstructed.

As technology preventing the increase of such leakage current, the "multi-threshold complementary metal oxide semiconductor" (MTCMOS) circuit technology is known. In a MTCMOS, for example, a transistor switch having a high threshold voltage is arranged in a power line of each circuit block performing a specific function. When the circuit block becomes unused in state, the transistor switch is set to the off position and the leakage current flowing through each transistor in the circuit block is shut off. By this, useless leakage current flowing through unused circuit blocks can be greatly reduced.

SUMMARY OF THE INVENTION

In the design of semiconductor integrated circuits incorporating MTCMOS technology, however, the layout design for arranging the transistor switches in the power lines is generally carried out manually. For example, the arrangement and interconnect lines of circuit cells inside each circuit block performing a specific function are automatically designed by a CAD device for each circuit block, then a transistor switch is manually arranged in the power line at the outside of the circuit block. For this reason, there are the disadvantages that the load of the design work increases and the development period of the product becomes long.

Further, along with the reduction of the power supply voltage, a slight voltage drop occurring in a resistive component of the power line starts to exert a large influence upon the delay of the signal. Namely, the lower the power supply voltage, the smaller the margin of the signal amplitude with respect to the threshold voltage of a transistor, so a large signal delay occurs even if the drop of the power supply voltage is small.

When a transistor switch is arranged in a power line under such a situation, the voltage drop due to this is further added, so the above problem becomes more serious. Especially, the signal delay at the center of the circuit block where the distance from the external power line becomes long becomes large. As a result, there is the problem that even if the circuit block normally operates by itself, it no longer operates when a transistor switch is arranged in the external power line. Further, when the circuit block is further connected to a block of a higher level, there is the problem that the requested timing can no longer be satisfied.

There is a need for providing a semiconductor integrated circuit able to reduce the load of the layout design for arranging the power switches and able to reduce the influence of the voltage drop occurring in power switches exerted upon signal delay.

According to one embodiment of the present invention, there is provided a semiconductor integrated circuit including a plurality of circuit cells; a plurality of groups of power lines arranged in stripe shapes; a plurality of groups of branch lines branching from the groups of power lines and supplying power to at least one of the circuit cells; and a power switch cell arranged in at least one group of branch lines and turning on or off the supply of power to the circuit cell in accordance with an input control signal.

According to one embodiment of the present invention, a plurality of groups of power lines are arranged in stripe shapes, and power is supplied to the circuit cells by a plurality of groups of branch lines branching from the groups of power lines. The power switch cell arranged in the group of branch lines controls the supply of power to the circuit cell.

For this reason, the power switch cells are arranged dispersed in the area of arrangement of the circuit cells. The supply of power by the power switch cells is finely controlled for each relatively small number of circuit cells. Due to this, in comparison with the method of providing a power switch for each circuit block, the voltage drop of the power by the power switch becomes small and the degree of freedom of arrangement of the power switch cells is raised.

Preferably, each group of branch lines is formed extending in a direction forming a predetermined angle with the group of power lines from which the group of branch lines branch. Due to this, the symmetry of the interconnect line structures of the power rises.

Further, preferably, each power switch cell includes at least one transistor arranged in at least one branch line included in the group of branch lines and turning on or off in accordance with the control signal. This transistor has a drive capability according to the power consumption of the circuit cell to which power is supplied through the branch line when the transistor is in the on state. For example, the larger the power consumption, the larger the drive capability.

By setting the drive capability of the switch transistor to a suitable magnitude in accordance with the power consumption of the circuit cell to which power is supplied through the switch transistor, in comparison with the case where the drive capability of the transistor switch is uniformly set, it becomes possible to reduce the circuit area and the leakage current while suppressing the reduction of the power supply voltage.

At least part of each power switch cell may be included in an area under a group of power lines. In this case, the group of branch lines may include a via interconnect line branching from a power line of the group of power lines and extending to the lower layer. Due to this, the density of arrangement of the circuit cells is improved.

Each power switch cell may include a first interconnect line connected to two branch lines supplying power to the circuit cell, facing each other across the power switch cell, and extending in opposite directions from each other; a second interconnect line connected to a branch line branching from a power line of the group of power lines; and a switch circuit connected between the first interconnect line and the second interconnect line and turning on or off in accordance with the control signal as well.

The power switch cell may include a third interconnect line connected to a branch line supplying power to the circuit cell; a fourth interconnect line connected to a branch line, the branch line branching from a power line of the group of power lines and extending in an opposite direction of the branch line connected to the third interconnect line; and a switch circuit connected between the third interconnect line and the fourth interconnect line and turning on or off in accordance with the control signal as well.

The group of branch lines may include a first branch line and a second branch line connected to a power line of the group of power lines as well. In this case, the power switch cell may turn on or off a connection between the first branch line and the second branch line in accordance with the control signal as well. Further, the plurality of circuit cells may include a first circuit cell supplied with power from the first branch line and a second circuit cell supplied with power from the second branch line as well.

In this case, the first branch line and the second branch line may be formed in a same interconnect line layer side by side or may be formed in different interconnect line layers and facing each other.

Further, in this case, each power switch cell may comprise a fifth interconnect line connected to the first branch line; a sixth interconnect line connected to the second branch line; and a switch circuit connected between the fifth interconnect line and the sixth interconnect line and turning on or off in accordance with the control signal.

According to one embodiment of the present invention, the degree of freedom of arrangement of the power switch cells becomes high, and automatic design of the layout by the CAD device can be easily realized, so the load of the layout design can be reduced.

Further, the voltage drop of the power due to the power switch cells can be suppressed, so the influence of the voltage drop occurring in the power switch cells exerted upon the signal delay can be reduced.

BRIEF DESCRIPTION OF THE DRAWINGS

These and other objects and features of the present invention will become clearer from the following description of the preferred embodiments given with reference to the attached drawings, wherein.

BEST MODE FOR WORKING THE INVENTION

Figure 1:
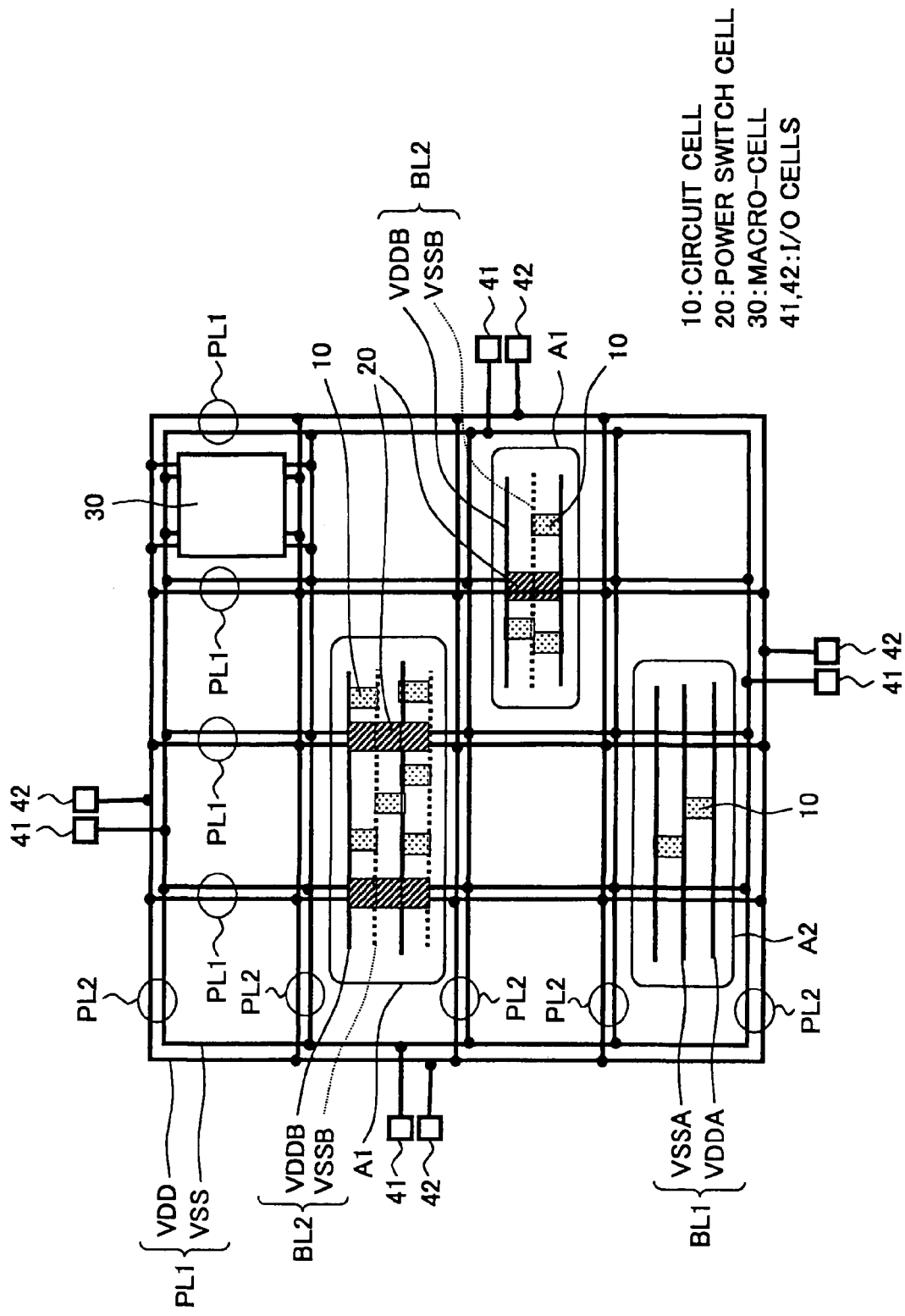
FIG. 1 is a view of an example of the configuration of a semiconductor integrated circuit according to a first embodiment.

Below, an explanation will be given of six embodiments of the present invention by referring to the drawings.

First Embodiment

FIG. 1 is a view of an example of the configuration of a semiconductor integrated circuit according to a first embodiment of the present invention. In the figure, interconnect lines relating to the power and circuit cells connected to them are schematically illustrated.

The semiconductor integrated circuit shown in FIG. 1 has a plurality of groups of power lines PL1, a plurality of groups of power lines PL2, a plurality of groups of branch lines BL1 and BL2, a plurality of circuit cells 10, a plurality of power switch cells 20, a circuit block 30, and a plurality of power input cells 41 and 42.

Note that the groups of power lines PL1 are embodiments of the groups of power lines of the present invention, the groups of branch lines BL2 are embodiments of the groups of branch lines of the present invention, the circuit cells 10 are embodiments of the circuit cells of the present invention, and the power switch cells 20 are embodiments of the power switch cells of the present invention.

The groups of power lines PL1 are arranged in stripe shapes in the example of FIG. 1, and they are arranged in parallel at substantially equal intervals. The groups of power lines PL2 are arranged in stripe shapes in a direction perpendicular to the groups of power lines PL1. In the example of FIG. 1, they are arranged in parallel at substantially equal intervals. These stripe shaped groups of power lines PL1 and stripe shaped groups of power lines PL2 intersect each other and form lattice stripe shaped power line patterns.

The groups of power lines PL1 and PL2 have power lines VDD and VSS. At intersecting points of the lattice stripe shaped power line patterns, the power lines VDD and the power lines VSS of the groups of power lines PL1 and PL2 are connected to each other.

In the lattice stripe shaped power line patterns, power input cells 41 and 42 are connected to the groups of power lines PL1 and PL2 of a rectangular frame. The power line VSS is connected to the power input cell 41, and the power line VDD is connected to the power input cell 42.

The power supply voltage is supplied through these power input cells 41 and 42 to the power lines VSS and VDD from the outside of the semiconductor integrated circuit.

The groups of branch lines BL1 and BL2 branch from the groups of power lines PL1 and supply power to the basic units of the circuit in the semiconductor integrated circuit, that is, the circuit cells 10. Further, the groups of branch lines BL1 and BL2 are formed extending in directions forming predetermined angles with the groups of power lines PL1. For example, as shown in FIG. 1, they are formed extending in directions perpendicular to the groups of power lines PL1.

A plurality of such groups of branch lines branch from one group of power lines PL1. A plurality of circuit cells 10 are connected to the groups of branch lines. The circuit cells 10 included in the semiconductor integrated circuit are basically supplied with power from these groups of branch lines. Note that the circuits not needing cutoff of power since they are always operating, etc., include circuits directly supplied with power from the groups of power lines without going through the groups of branch lines, for example, the circuit block 30 shown in FIG. 1.

Each group of branch lines BL1 has two branch lines (VDDA and VSSA). The branch line VDDA is connected to the power line VDD, while the branch line VSSA is connected to the power line VSS. On the other hand, each group of branch lines BL2 has two branch lines (VDDB and VSSB). The branch line VDDB is connected to the power line VDD, while the branch line VSSB is connected to the power line VSS. The difference of the groups of branch lines BL1 and BL2 resides in the insertion or non-insertion of the power switch cell 20. Namely, the power switch cell 20 only is inserted in the group of branch lines BL2.

The power switch cell 20 receives as input a not illustrated control signal and accordingly turns on or off the supply of power to the circuit cell 10 connected to the group of branch lines BL2. For example, the power switch cell 20 includes a switch transistor. The switch transistor is arranged in at least one branch line of the group of branch lines BL2 and turns on or off in accordance with the input control signal.

In the case of a MTCMOS type semiconductor integrated circuit, a high threshold voltage MOS transistor is used for this switch transistor. For example, when cutting the branch line VSSB in accordance with the control signal, a high threshold voltage n-type MOS transistor is used as the switch transistor. When cutting the branch line VDDB in accordance with the control signal, a high threshold voltage p-type MOS transistor is used.

Figure 2:
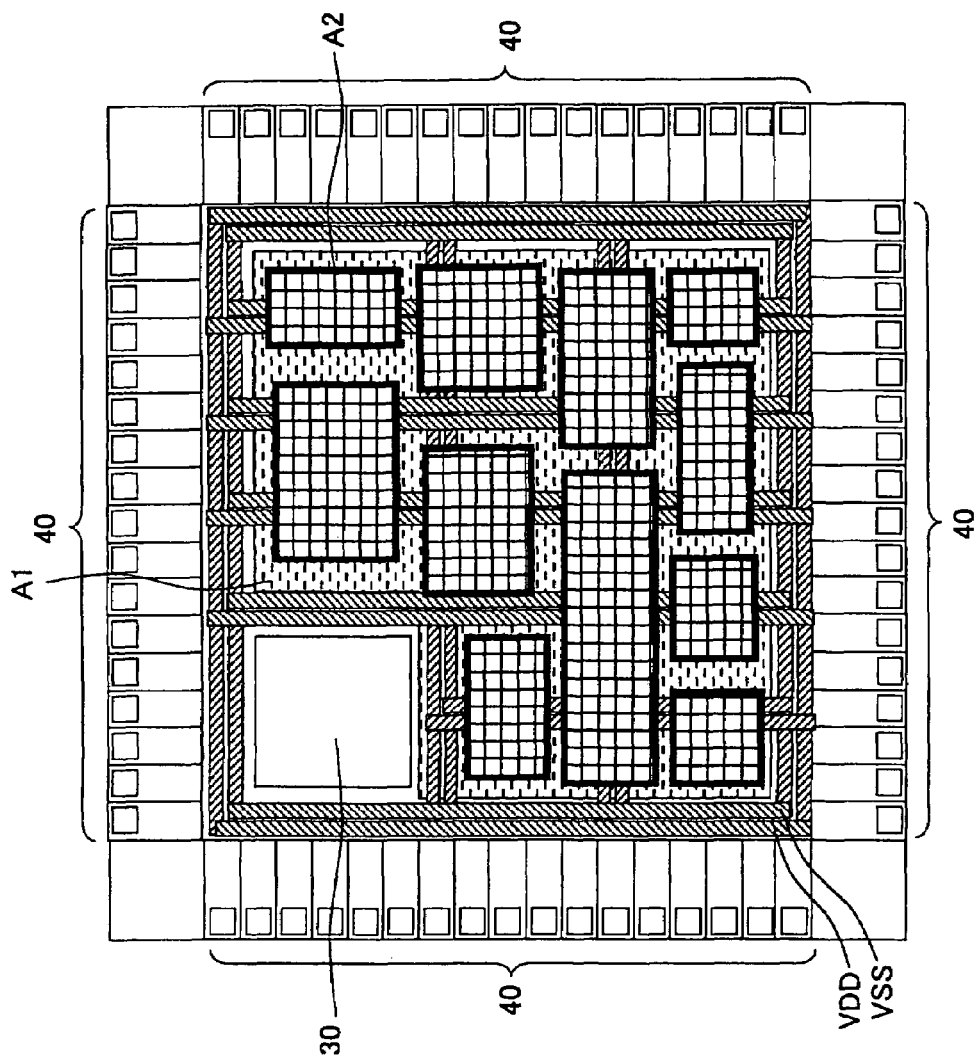
FIG. 2 is a view of an example of a layout of the semiconductor integrated circuit according to the first embodiment.

FIG. 2 is a view of an example of the layout of a semiconductor integrated circuit according to the present embodiment. In FIG. 2, the reference numerals "40" indicate input/output use cells including power input cells 41 and 42. Other than this, the same notations in FIG. 1 and FIG. 2 indicate the same components.

A plurality of input/output use cells 40 are arranged in lines on the four sides of a rectangular semiconductor chip on which a semiconductor integrated circuit is formed. Lattice stripe shaped power line patterns are formed inside the semiconductor chip surrounded by these input/output use cells 40.

The inside of the lattice stripe shaped power line patterns may be roughly divided into a non-power cutoff area A1, a power cutoff area A2, and other areas. In the non-power cutoff area A1, a circuit cell 10 connected to the group of branch lines BL1 is arranged. In the power cutoff area A2, a circuit cell 10 connected to the group of branch lines BL2 is arranged. In the other areas, circuit cells not connected to the groups of branch lines BL1 and BL2 are arranged. It is possible to freely determine ranges of the power cutoff areas A1 and A2 shown in FIG. 2 by selecting insertion or non-insertion of a power switch cell 20 in each group of branch lines.

Figure 3:
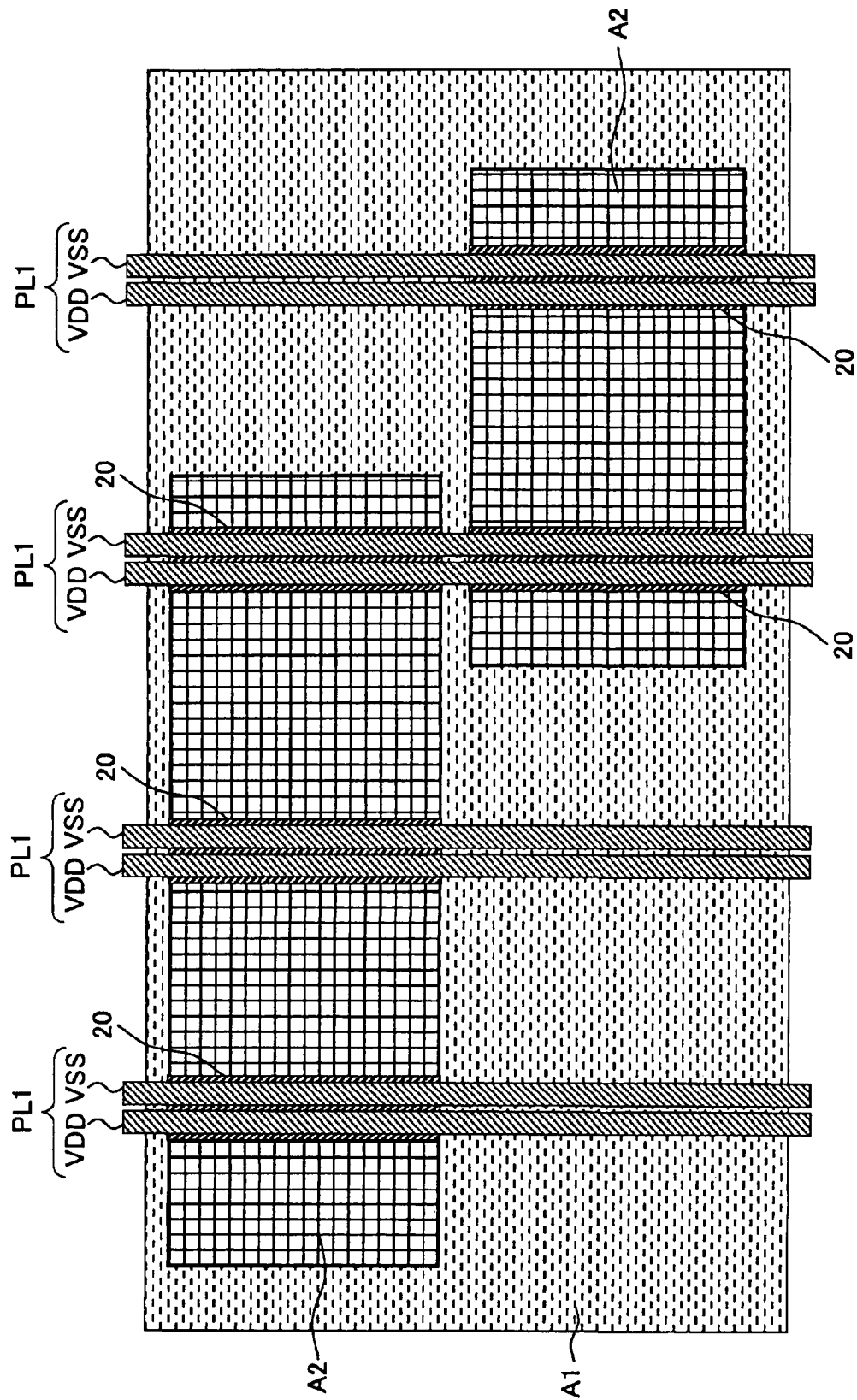
FIG. 3 is an enlarged view of the example of layout of the semiconductor integrated circuit according to the first embodiment.

FIG. 3 is an enlarged view of an example of the layout of the semiconductor integrated circuit according to the present embodiment. The same notations in FIG. 1 and FIG. 3 indicate the same components.

In the example of FIG. 3, part of each power switch cell 20 is included in an area under the group of power lines PL1. Interconnect lines branching from the group of power lines PL1 to each power switch cell 20 include, for example, via interconnect lines extending under the group of power lines PL1.

As described above, according to the semiconductor integrated circuit according to the present embodiment, a plurality of groups of power lines PL1 are arranged in stripe shapes, and power is supplied to the circuit cells 10 by a plurality of groups of branch lines BL2 branching from the groups of power lines PL1. Power switch cells 20 arranged in the groups of branch lines BL2 turn on and off the supply of power to the circuit cells 10.

For this reason, a plurality of power switch cells 20 are widely arranged dispersed in the area where the circuit cells 10 can be arranged. It then becomes possible to finely control the supply of power for every relatively small number of circuit cells by each power switch cell 20.

Due to this, in comparison with the method of providing a power switch for each large scale circuit block, the power current flowing through each power switch cell 20 is reduced, and the power supply voltage drop can be made small. As a result, the influence of the voltage drop occurring in the power switch cells 20 exerted upon the signal delay can be reduced.

Further, in comparison with the conventional method of arranging each power switch outside of the circuit block, the degree of freedom of arrangement of the power switch cells 20 becomes high, and the power cutoff area can be freely determined as shown in FIG. 2 and FIG. 3. Due to this, it becomes possible to easily realize automatic design of the layout including the power switch cells 20, so the load of the design work conventionally performed manually is reduced and the development period can be shortened.

Further, each group of branch lines BL2 is formed extending in a direction perpendicular to the group of power lines PL1 from which it branches, so the symmetry of the interconnect line structures of the power switch cell becomes high.

Due to this, it becomes possible to more easily realize automatic design of a layout including the power switch cells 20.

Further, as shown in FIG. 3, by arranging each power switch cell 20 so that at least a part thereof is included in an area under a group of power lines PL1, the areas under the groups of power lines PL1 can be effectively utilized, so the circuit area can be reduced and the density of arrangement of the circuit cells 10 can be raised.

Second Embodiment

Next, a second embodiment of the present invention will be explained.

The semiconductor integrated circuit according to the second embodiment shows the configurations of the power switch cells and circuit cells and the structures of the groups of branch lines connecting them in more detail than the semiconductor integrated circuit according to the first embodiment. The overall configuration, such as the arrangement of the groups of power lines, is the same as that of the semiconductor integrated circuit according to the first embodiment.

Figure 4:
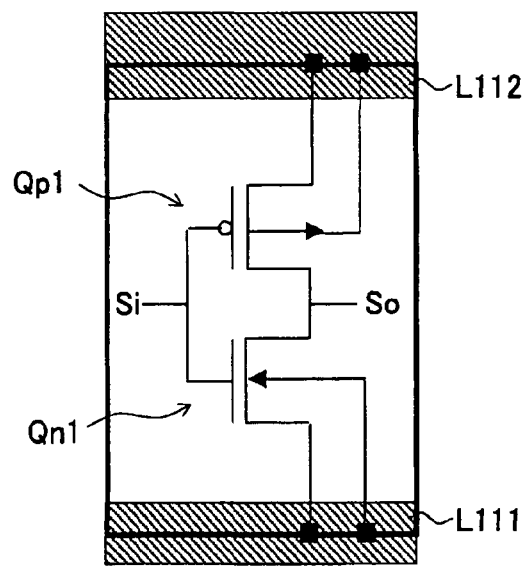
FIG. 4 is a view of an example of the configuration of a circuit cell according to a second embodiment.

FIG. 4 is a view of an example of the configuration of a circuit cell 11 according to the second embodiment of the present invention. The circuit cell 11 shown in FIG. 4 has an inverter circuit configured as a serial circuit of a p-type MOS transistor Qp1 and an n-type MOS transistor Qn1 and has interconnect lines L111 and L112 supplying power to this inverter circuit. Note that while FIG. 4 shows an inverter circuit cell as one example, the circuit cells 11 explained in the present embodiment also may include various other circuit cells used as basic circuits, for example, NAND circuit cells.

The interconnect line L111 is connected to a branch line VSSB supplying a potential VSS to the circuit cell 11. The interconnect line L111 has the same potential as the power line VSS when the power switch cell 21 explained later is in the on state.

The interconnect line L112 is connected to a branch line VDDB branching from the power line VDD. The interconnect line L112 has the same potential as the power line VDD.

These interconnect lines L111 and L112 are formed at opposite side portions of the rectangular circuit cell 11. The inverter circuit is arranged between these facing side portions.

Figure 5:
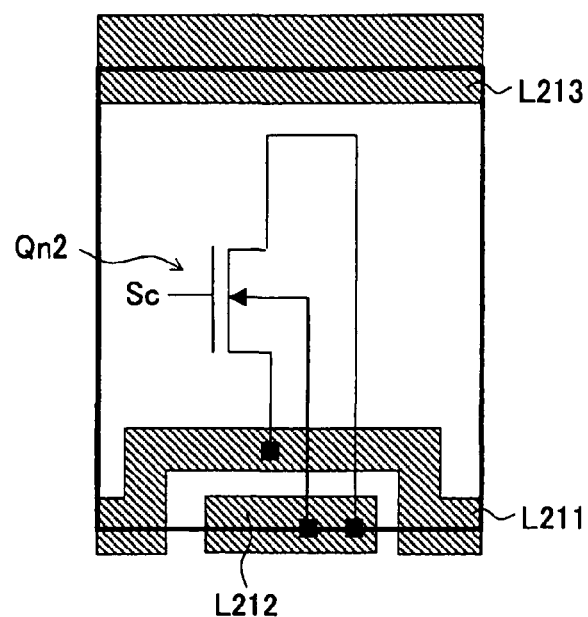
FIG. 5 is a view of an example of the configuration of a power switch cell according to the second embodiment.

FIG. 5 is a view of an example of the configuration of a power switch cell 21 according to the present embodiment. The power switch cell 21 has a n-type MOS transistor Qn2 and interconnect lines L211 to L213. The n-type MOS transistor Qn2 is an embodiment of the switch circuit of the present invention, the interconnect line L211 is an embodiment of the first interconnect line of the present invention, and the interconnect line L212 is an embodiment of the second interconnect line of the present invention.

Figure 6:
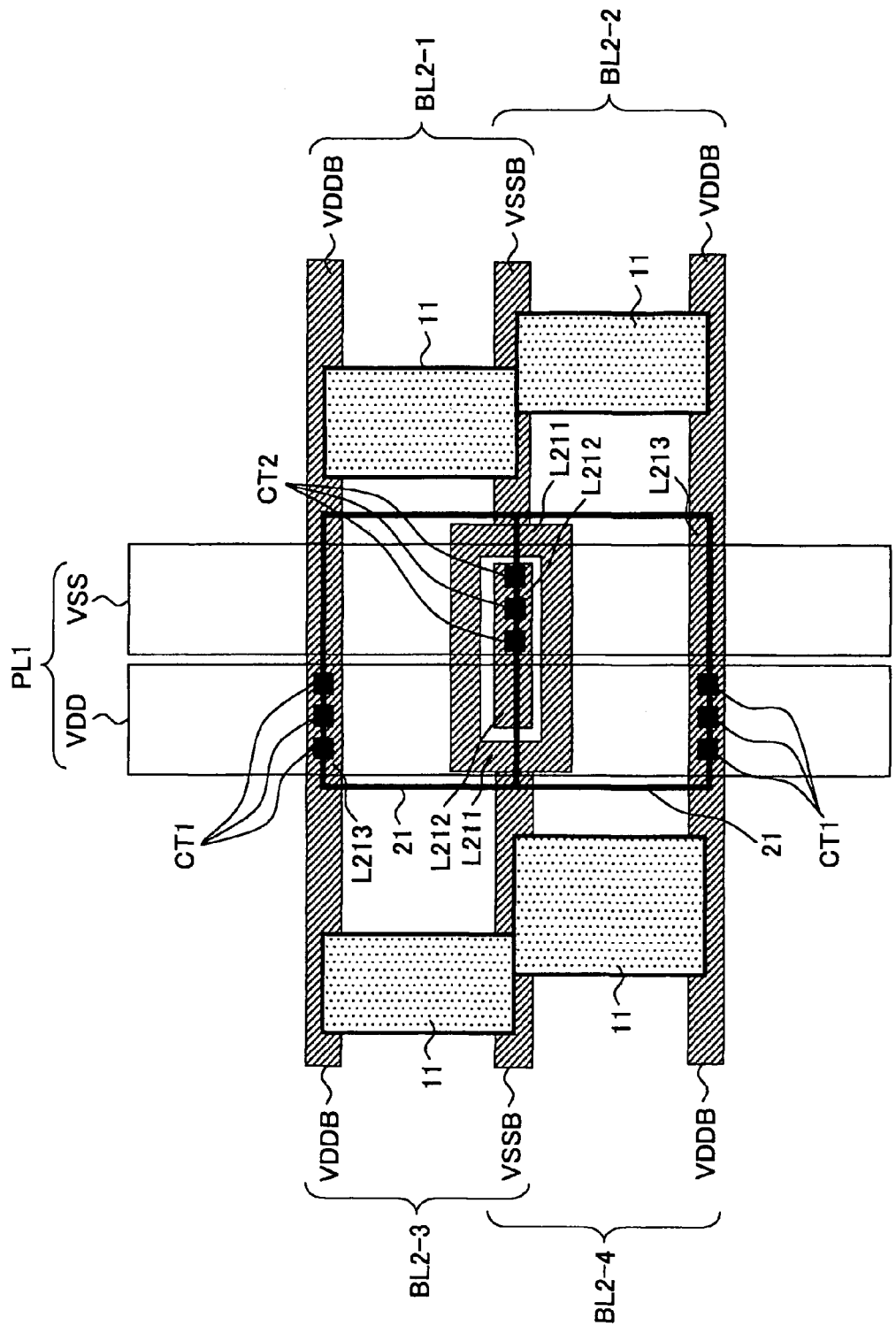
FIG. 6 is a view of an example of the layout of the semiconductor integrated circuit according to the second embodiment.

The interconnect line L211 is an interconnect line connected to two branch lines VSSB supplying the potential VSS to different circuit cells 11. These two branch lines VSSB extend in opposite directions to each other across the power switch cell 21 as shown in FIG. 6. When the power switch cell 21 is on, power is supplied to the circuit cells 11 connected to it.

The interconnect line L212 is connected to a branch line branching from the power line VSS. The interconnect line L212 has the same potential as that of the power line VSS.

The interconnect line L213 is connected to the branch line VDDB branching from the power line VDD. The interconnect line L213 has the same potential as that of the power line VDD.

The n-type MOS transistor Qn2 has a drain that is connected to the interconnect line L211, a source and a substrate that are connected to the interconnect line L212, and a gate that receives as input a control signal Sc. The n-type MOS transistor Qn2 turns on or off in accordance with the control signal Sc.

When the n-type MOS transistor Qn2 turns on, the interconnect line L211 and the interconnect line L212 are connected, and power is supplied to the circuit cell 11 connected to the two branch lines VSSB. When the n-type MOS transistor Qn2 turns off, the interconnect line L211 and the interconnect line L212 are disconnected, and the supply of power to the circuit cell 11 is cut off.

The interconnect line L211 is formed at one side portion of the rectangular power switch cell 2. A part thereof is sunken in an U-shape toward the inside of the power switch cell 21. The interconnect line L212 is formed in this U-shape recess. The interconnect line L213 is formed in the side portion facing to the interconnect line L211. The n-type MOS transistor Qn2 is arranged between the interconnect lines L211 and L213.

FIG. 6 is a view of an example of the layout of the semiconductor integrated circuit according to the present embodiment. In the example of FIG. 6, groups of branch lines BL2-1 to BL2-4 branch from the groups of power lines PL1. The respective groups of branch lines BL2-1 to BL2-4 have branch lines VDDB and VSSB. All branch lines extend in directions perpendicular to the groups of power lines PL1.

The groups of branch lines BL2-1 and BL2-2 are adjacent to each other and share the branch line VSSB. The groups of branch lines BL2-3 and BL2-4 are adjacent to each other and share the branch line VSSB.

The groups of branch lines BL2-1 and BL2-3 branch from a common branch point of the groups of power lines PL1 and extend in opposite directions to each other across a common power switch cell 21. The groups of branch lines BL2-2 and BL2-4 branch from a common branch point of the groups of power lines PL1 and extend in opposite directions to each other across a common power switch cell 21.

Further, at least parts of the power switch cell 21 connected to the groups of branch lines BL2-1 and BL2-3 and the power switch cell 21 connected to the groups of branch lines BL2-2 and BL2-4 are included in areas under the groups of power lines PL1.

The interconnect line branching from the power line VSS to the interconnect line L212 includes via interconnect lines CT2 branching from the power line VSS and extending to the lower layer. The via interconnect lines CT2 connect the power line VSS and the interconnect line L212 in the lower layer. The interconnect line branching from the power line VDD to the interconnect line L213 includes via interconnect lines CT1 branching from the power line VDD and extending to the lower layer. The via interconnect lines CT1 connect the power line VDD and the interconnect line L213 in the lower layer.

Further, these two power switch cells 21 are adjacent to each other, and interconnect lines L211 of the two are electrically connected, and therefore they function as two parallel connected switches. Accordingly, the n-type MOS transistors Qn2 of these two power switch cells 21 are controlled so as to turn on or off together by the same control signal Sc.

As explained above, according to the present embodiment, in place of the two power lines (VDD, VSS) configuring the group of power lines PL1, two branch lines (VDDB, VSSB) configuring the group of branch lines are connected to the circuit cell 11, and therefore it is possible to use a general circuit cell used in a conventional semiconductor integrated circuit for the circuit cell 11 of the present embodiment.

Further, since each power switch cell 21 is arranged so that at least a part thereof is included in an area under the group of power lines PL1, the density of arrangement of the circuit cells 11 can be raised.

Further, since adjacent groups of branch lines and power switch cells share interconnect lines, the circuit area can be reduced. In addition, the same effect can be exhibited by the same configuration as that of the semiconductor integrated circuit according to the first embodiment.

Note that, in the example of FIG. 6, since two power switch cells 21 are connected in parallel, operation is possible even if reduced to one power switch cell 21. Namely, it also is possible to control the power supply of four groups of branch lines by one power switch cell 21.

Third Embodiment

Next, a third embodiment of the present invention will be explained.

The semiconductor integrated circuit according to the third embodiment is obtained by changing parts of the configurations of the power switch cells and the interconnect line structures in the second embodiment explained above. The overall configuration, such as the arrangement of the groups of power lines and the configuration of the circuit cells, is the same as those of the semiconductor integrated circuits according to the first and second embodiments.

Figure 7:
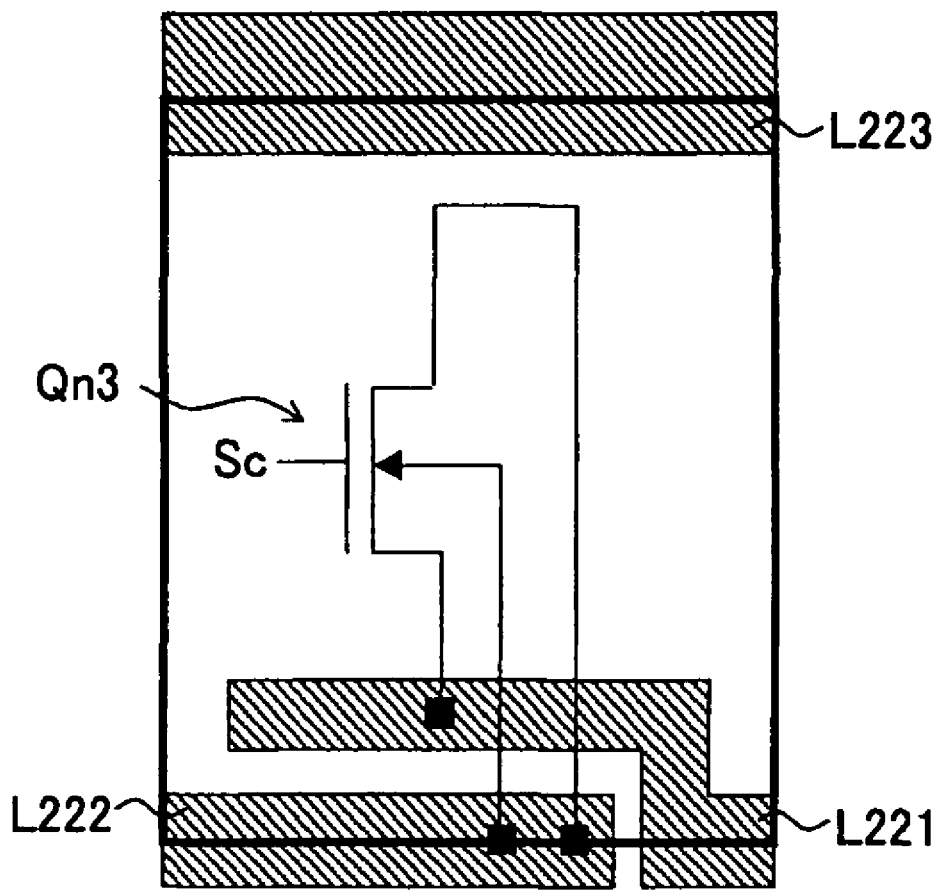
FIG. 7 is a view of an example of the configuration of a power switch cell according to a third embodiment.

FIG. 7 is a view of an example of the configuration of a power switch cell 22 according to the third embodiment of the present invention. The power switch cell 22 has a n-type MOS transistor Qn3 and interconnect lines L221 to L223. The n-type MOS transistor Qn3 is an embodiment of the switch circuit of the present invention, the interconnect line L221 is an embodiment of the third interconnect line of the present invention, and the interconnect line L222 is an embodiment of the fourth interconnect line of the present invention.

The interconnect line L221 is connected to a branch line VSSB1 supplying the potential VSS to the circuit cell 11. Unlike the interconnect line L211 of the power switch cell 21 explained above, the number of branch lines connected to the interconnect line L221 is one.

Figure 8:
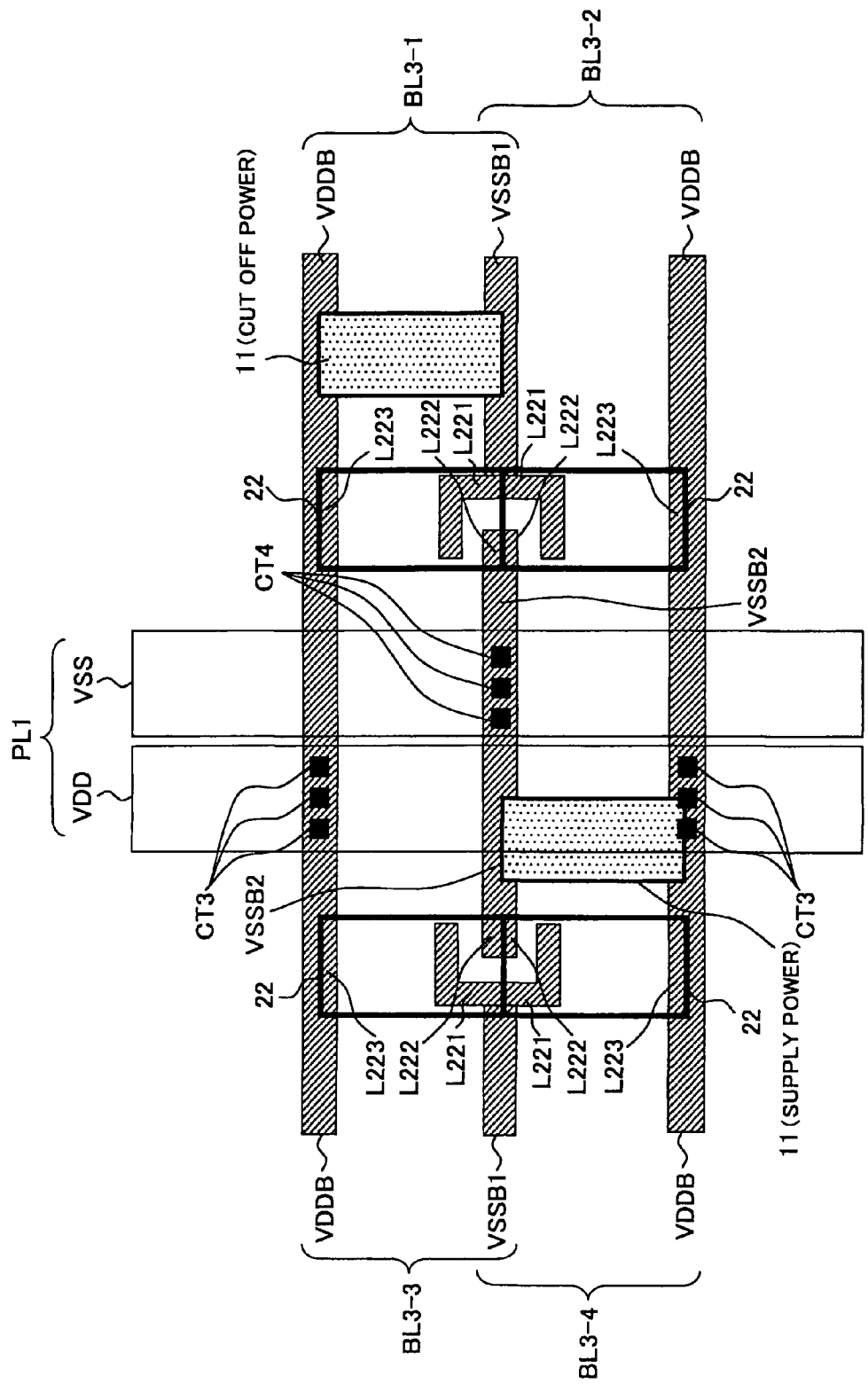
FIG. 8 is a view of an example of the layout of the semiconductor integrated circuit according to the third embodiment.

The interconnect line L222 is connected to a branch line VSSB2 branching from the power line VSS. The interconnect line VSSB2 extends in an opposite direction to the branch line VSSB1 as shown in FIG. 8. Namely, the interconnect line VSSB2 and the interconnect line VSSB1 extend in opposite directions to each other across the power switch cell 21.

The interconnect line L223 is connected to the branch line VDDB branching from the power line VDD. The interconnect line L223 has the same potential as that of the power line VDD.

The n-type MOS transistor Qn3 has a drain that is connected to the interconnect line L221, a source and substrate that are connected to the interconnect line L222, and a gate that receives as input a control signal Sc. The n-type MOS transistor Qn3 turns on or off in accordance with the control signal Sc. When the n-type MOS transistor Qn3 turns on, the interconnect line L221 and the interconnect line L222 are connected, and power is supplied to the circuit cell 11 connected to the branch line VSSB1. When the n-type MOS transistor Qn3 turns off, the interconnect line L221 and the interconnect line L222 are disconnected, and the supply of power to the circuit cell 11 is cut off.

The interconnect line L222 starting from one corner of the rectangular power switch cell 22 extends along the side of the rectangle. The terminal end of the interconnect line L222 stops before reaching the other corner. The interconnect line L221 starting from that other corner extends along the same side as the interconnect line L222 and, in the middle of the side, bends toward the inside of the power switch cell 22 in order to avoid the interconnect line L221. Then, it extends in parallel to the interconnect line L221 in a line from this bent portion to the terminal end. The interconnect line L223 is formed in the other side portion facing the side on which the interconnect line L222 is formed. The n-type MOS transistor Qn3 is formed in an area between the interconnect line L221 and the interconnect line L223.

FIG. 8 is a view of an example of the layout of the semiconductor integrated circuit according to the present embodiment. In the example of FIG. 8, the groups of branch lines BL3-1 to BL3-4 branch from the group of power lines PL1. Each of the groups of branch lines BL3-1 to BL3-4 has branch lines VDDB and VSSB. Each branch line VSSB further includes branch lines VSSB1 and VSSB2.

Each branch line VDDB is connected to a power line VDD through via interconnect lines CT3. Each branch line VSSB2 is connected to a power line VSS through via interconnect lines CT4. Each branch line VSSB1 is connected to a branch line VSSB2 through a power switch cell 22. These branch lines all extend in a direction perpendicular to the group of power lines PL1.

The groups of branch lines BL3-1 and BL3-2 are adjacent to each other and share the branch lines VSSB (VSSB1 and VSSB2). The groups of branch lines BL3-3 and BL3-4 are adjacent to each other and share the branch lines VSSB (VSSB1 and VSSB2).

The groups of branch lines BL3-1 and BL3-3 branch from a common branch point of the group of power lines PL1 and extend in opposite directions to each other from this branch point. The groups of branch lines BL3-2 and BL3-4 branch from a common branch point of the group of power lines PL1 and extend in opposite directions to each other from this branch point.

The power switch cells 22 inserted in the groups of branch lines BL3-1 and BL3-2 are adjacent to each other and are electrically connected to the interconnect line L221. For this reason, these two power switch cells 22 function as two switches connected in parallel. Accordingly, the n-type MOS transistors Qn3 of these two power switch cells 22 are controlled so as to turn on or off together by the same control signal Sc. The same is also true for the two power switch cells 22 inserted in the groups of branch lines BL3-3 and BL3-4 and controlled by the same control signal Sc.

As explained above, according to the present embodiment, in the same way as the second embodiment, in place of the two power lines (VDD, VSS) configuring the group of power lines PL1, the two branch lines (VDDB, VSSB) configuring the group of the branch lines are connected to each circuit cell 11, so it is possible to easily use general circuit cells used in a conventional semiconductor integrated circuit for the circuit cells 11 of the present embodiment.

Further, of the two branch lines VSSB1 and VSSB2 extending in opposite directions across the power switch cell 22, the branch line VSSB1 is controlled in power by the n-type MOS transistor Qn3, and the branch line VSSB2 is constantly supplied with power from the power line VSS. For this reason, it is also possible to arrange a constantly operated circuit cell 11 in an empty space between the group of power lines PL1 and the power switch cell 22 as shown in FIG. 8 and supply power from the branch lines VSSB2 and VDDB.

Further, when there are no constantly operated circuit cells 11, it is also possible that at least part of each power switch cell 22 is included in the area under the group of power lines PL1. Due to this, the density of arrangement of the circuit cells 11 can be improved.

Further, the example of FIG. 8 is structured by two power switch cells 22 connected in parallel, and therefore operation is possible even if these are reduced to one power switch cell 22. Namely, it is also possible to control the power supply of two groups of branch lines by a single power switch cell 21.

Further, in the present embodiment, in the same way as the first embodiment, the groups of branch lines and the power switch cells adjacent to each other share interconnect lines, so the circuit area can be reduced. Other than this, the same effect can be exhibited by the same configuration as that of the semiconductor integrated circuit according to the first embodiment.

Fourth Embodiment

Next, a fourth embodiment of the present invention will be explained.

The semiconductor integrated circuit according to the fourth embodiment is obtained by changing the configuration of the semiconductor integrated circuits according to the second and third embodiments in which the groups of branch lines were configured by two branch lines to a configuration in which the groups of branch lines are configured by three branch lines so that circuit cells constantly needing power can be freely arranged at the groups of branch lines. The overall configuration, such as the arrangement of the groups of power lines, is the same as that of the semiconductor integrated circuit according to the first embodiment.

Figure 9:
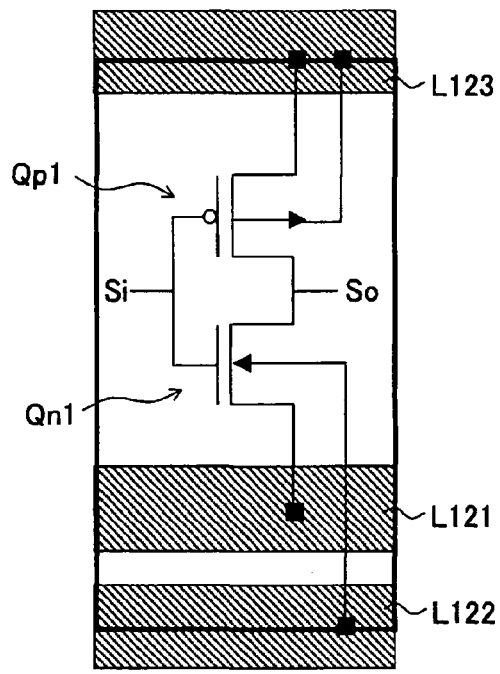
FIG. 9 is a view of an example of the configuration of a power cutoff type circuit cell according to a fourth embodiment.

FIG. 9 is a view of an example of the configuration of a circuit cell 12 according to the fourth embodiment of the present invention. The circuit cell 12 shown in FIG. 9 has an inverter circuit configured as a serial circuit of a p-type MOS transistor Qp1 and a n-type MOS transistor Qn1 and has interconnect lines L121 to L123 supplying power to this inverter circuit. Note that FIG. 9 shows an inverter circuit cell as an example, but the circuit cells 12 explained in the present embodiment also may include various circuit cells used as basic circuits, for example, NAND circuit cells.

The inverter circuit (Qp1, Qn1) is connected between the interconnect lines L121 and L123 and supplied with power from these interconnect lines. Accordingly, when a power switch cell 23 explained later is in the off state, the supply of power to the inverter circuit is cut off.

Note that, in the example of FIG. 9, the substrate of the p-type MOS transistor Qp1 is connected to the interconnect line L123, and the substrate of the n-type MOS transistor Qn1 is connected to the interconnect line L122. As will be explained later, the interconnect lines L122 and L123 are constantly connected to the power lines VSS and VDD, therefore, and regardless of cutoff or no cutoff of power, the substrate potentials of these MOS transistors can be held stable.

The interconnect line L121 is connected to a branch line VSSB3 supplying the power potential VSS to the circuit cell 12. The interconnect line L121 has the same potential as that of the power line VSS when a power switch cell 23 explained later is in the on state.

The interconnect line L122 is connected to a branch line VSSB4 in the same interconnect line layer as the branch line VSSB3. The interconnect line L122 has the same potential as that of the power line VSS.

The interconnect line L123 is connected to the branch line VDDB branching from the power line VDD. The interconnect line L123 has the same potential as that of the power line VDD.

The interconnect lines L122 and L123 are formed at opposite side portions of the rectangular circuit cell 12. The interconnect line L121 is formed at a position adjacent to the interconnect line L122 while extending in a direction parallel to this. The inverter circuit is arranged in an area between these interconnect lines L121 and L123.

Figure 10:
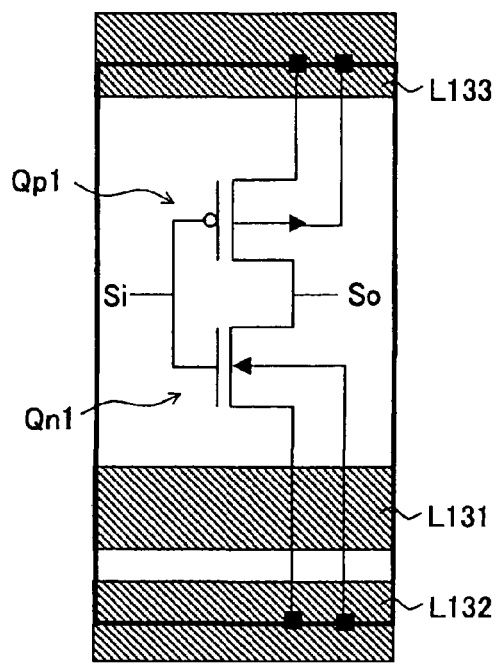
FIG. 10 is a view of an example of the configuration of a constantly powered circuit cell according to the fourth embodiment.

FIG. 10 is a view of an example of the configuration of a circuit cell 13 according to the present embodiment. The circuit cell 13 shown in FIG. 10 has an inverter circuit configured as a serial circuit of a p-type MOS transistor Qp1 and a n-type MOS transistor Qn1 and has interconnect lines L131 to L133 supplying power to this inverter circuit.

Interconnect lines L131, L132, and L133 in the circuit cell 13 correspond to the interconnect lines L121, L122, and L123 in the circuit cell 12 explained above. The structures of the two and the branch lines to which they are connected are the same.

The difference of the circuit cell 12 and the circuit cell 13 resides in the interconnect lines supplying power to the inverter circuit (Qp1, Qn1). Namely, the circuit cell 12 is supplied with power from the interconnect lines L121 and L123, and therefore the supply of power is cut off when the power switch cell 23 is off, but the circuit cell 13 is supplied with power from the interconnect lines L132 and L133, therefore power is constantly supplied regardless of the state of the power switch cell 23.

Figure 11:
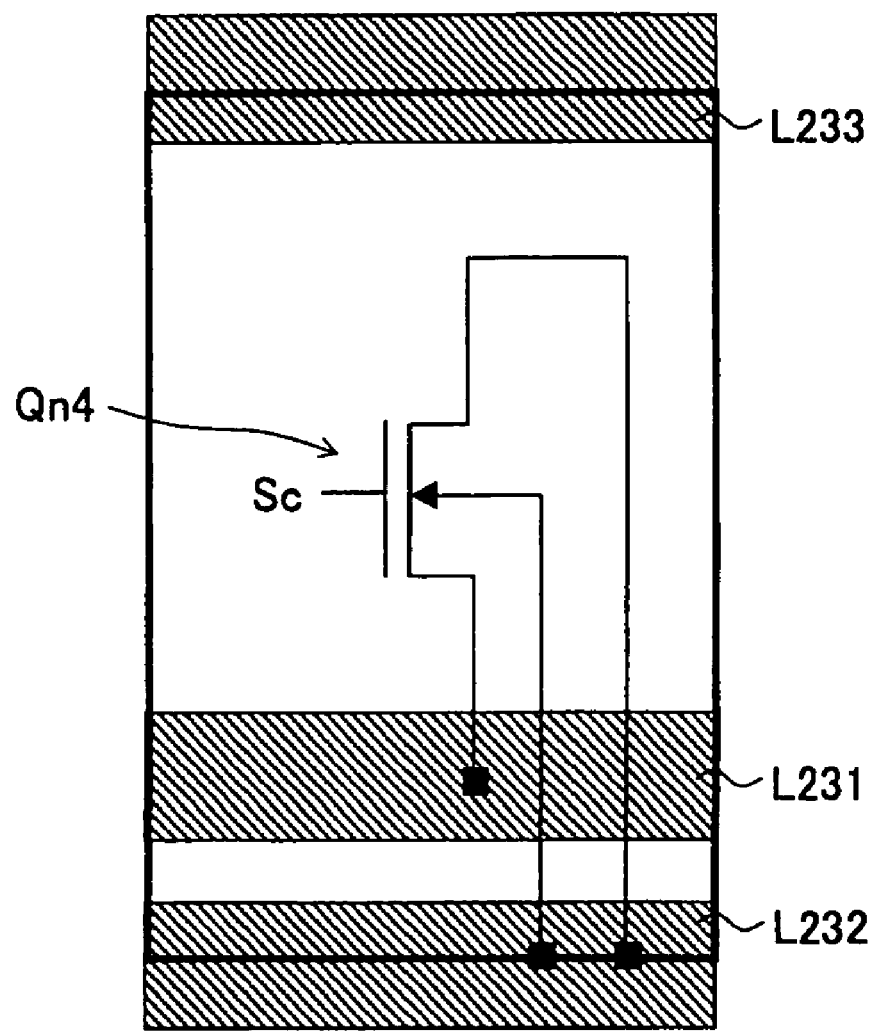
FIG. 11 is a view of an example of the configuration of a power switch cell according to the fourth embodiment.

FIG. 11 is a view of an example of the configuration of a power switch cell 23 according to the present embodiment. The power switch cell 23 has a n-type MOS transistor Qn4 and interconnect lines L231 to L233. The n-type MOS transistor Qn4 is an embodiment of the switch circuit of the present invention, the interconnect line L231 is an embodiment of the fifth interconnect line of the present invention, and the interconnect line L232 is an embodiment of the sixth interconnect line of the present invention.

The interconnect line L231 is an interconnect line connected to the branch line VSSB3 supplying power to the circuit cell 12. When the n-type MOS transistor Qn4 is on, it has the same potential as that of the power line VSS.

The interconnect line L232 is connected to the branch line VSSB4 branching from the power line VSS. The interconnect line L232 has the same potential as that of the power line VSS.

The interconnect line L233 is connected to the branch line VDDB branching from the power line VDD. The interconnect line L233 has the same potential as that of the power line VDD.

The n-type MOS transistor Qn4 has a drain that is connected to the interconnect line L231, a source and a substrate that are connected to the interconnect line L232, and a gate that receives as input a control signal Sc. The n-type MOS transistor Qn4 turns on or off in accordance with the control signal Sc.

When the n-type MOS transistor Qn4 turns on, the interconnect line L231 and the interconnect line L232 are connected, and power is supplied to the circuit cell 12 connected to the branch line VSSB3. When the n-type MOS transistor Qn4 turns off, the interconnect line L231 and the interconnect line L232 are disconnected, and the supply of power to the circuit cell 12 is cut off.

The interconnect lines L232 and L233 are formed at opposite side portions of the rectangular power switch cell 23. The interconnect line L231 is formed at a position adjacent to the interconnect line L232 while extending in a direction parallel to this. The n-type MOS transistor Qn4 is arranged in the area between these interconnect lines L231 and L233.

Figure 12:
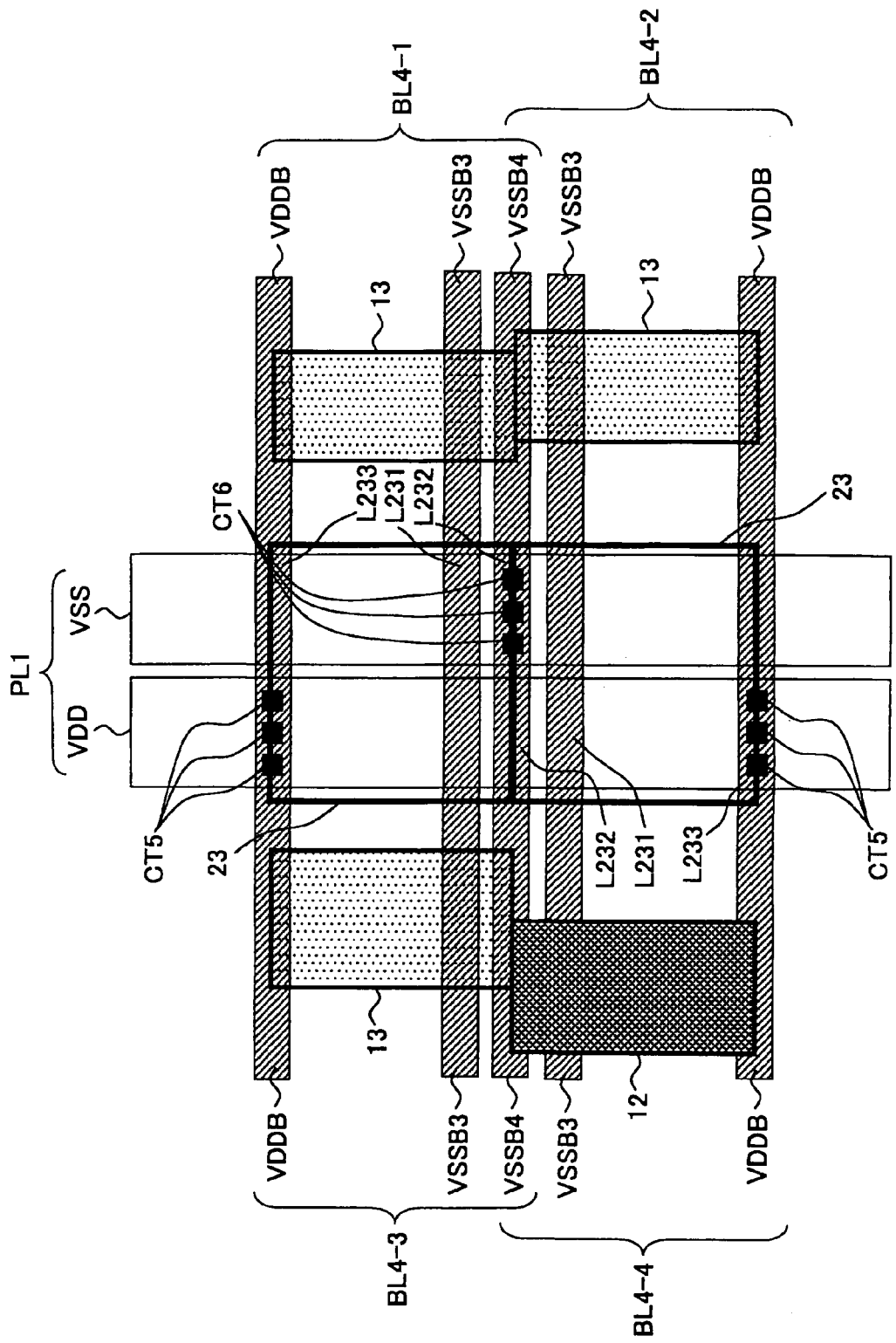
FIG. 12 is a view of an example of the layout of the semiconductor integrated circuit according to the fourth embodiment.

FIG. 12 is a view of an example of the layout of the semiconductor integrated circuit according to the present embodiment. In the example of FIG. 12, the groups of branch lines BL4-1 to BL4-4 branch from the group of power lines PL1. The respective groups of branch lines BL4-1 to BL4-4 have branch lines VDDB, VSSB3, and VSSB4. Note that the branch line VSSB3 is not directly connected to the power line VSS, but is connected to the power line VSS through the branch line VSSB4 when the power switch cell 23 is on. Further, all of these branch lines extend in directions perpendicular to the group of power lines PL1 and are formed in the same interconnect line layer side by side.

The groups of branch lines BL4-1 and BL4-2 are adjacent to each other and share the branch line VSSB4. The groups of branch lines BL4-3 and BL4-4 are adjacent to each other and share the branch line VSSB4.

The groups of branch lines BL4-1 and BL4-3 branch from a common branch point of the group of power lines PL1 and extend in opposite directions to each other across a common power switch cell 23. The groups of branch lines BL4-2 and BL4-4 branch from a common branch point of the group of power lines PL1 and extend in opposite directions to each other across a common power switch cell 23.

Further, at least parts of both of the power switch cell 23 connected to the groups of branch lines BL4-1 and BL4-3 and the power switch cell 23 connected to the groups of branch lines BL4-2 and BL4-4 are included in areas under the group of power lines PL1.

The interconnect line branching from the power line VSS to the interconnect line L232 includes via interconnect lines CT6 branching from the power line VSS and extending to the lower layer. The via interconnect lines CT6 connect the power line VSS and the interconnect line L232 in the lower layer. The interconnect line branching from the power line VDD to the interconnect line L233 includes via interconnect lines CT5 branching from the power line VDD and extending to the lower layer. The via interconnect line CT5 connects the power line VDD and the interconnect line L233 in the lower layer.

Figure 13:
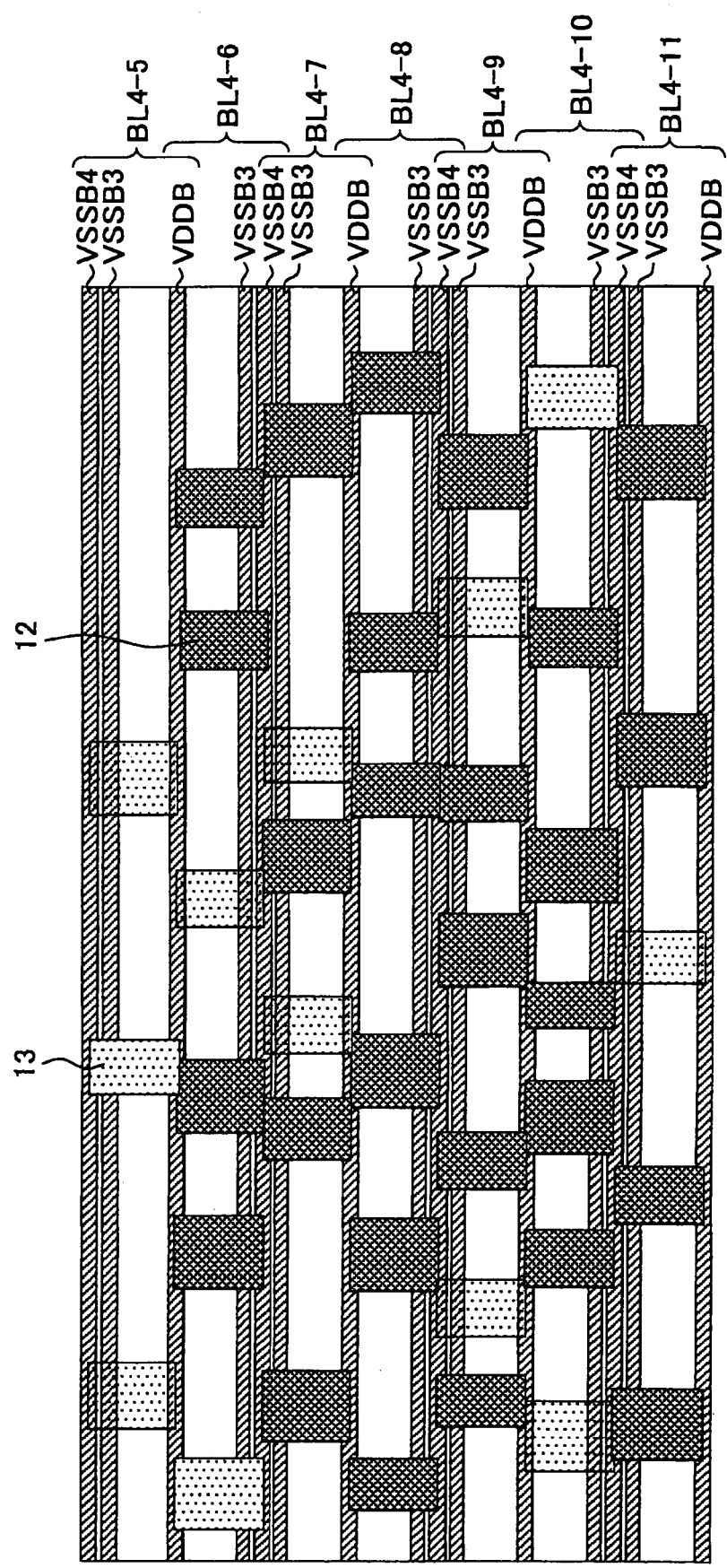
FIG. 13 is a view of an example of the arrangement of a power cutoff type circuit cell and a constantly powered circuit cell.

FIG. 13 is a view of an example of the arrangement of the circuit cells 12 and the circuit cells 13. As shown in FIG. 13, the circuit cells 12 and 13 can be arranged mixed at any positions on the groups of branch lines.

As explained above, the present embodiment has a branch line VSSB3 (first branch line) connected to a power line VSS through a switch circuit (Qn4) of a power switch cell 23 and a branch line VSSB4 (second branch line) directly connected to the power line VSS without going through the switch circuit (Qn4) and separately provides a circuit cell 12 (first circuit cell) supplied with power from the branch line VSSB3 and a circuit cell 13 (second circuit cell) supplied with power from the branch line VSSB4.

For this reason, as shown in FIG. 13, circuit cells 12 able to be cut off from the supply of power by the power switch cells 23 and circuit cells 13 constantly supplied with power can be arranged mixed at any positions on the groups of branch lines. Due to this, it becomes possible to very freely arrange circuits to be cut off in power and circuit to be constantly supplied with power, therefore the restrictions on the layout are reduced, and it becomes possible to realize automatic design of the layout including the power switch cells 23 by simpler processing.

Further, each power switch cell 23 is arranged so that at least a part thereof is included in an area under the group of power lines PL1, so the density of arrangement of the circuit cells 12 and 13 can be improved.

Further, in the present embodiment, the groups of branch lines adjacent to each other share branch lines. For example, in the example of FIG. 13, the groups of branch lines BL4-5 and BL4-6, the groups of branch lines BL4-7 and BL4-8, and the groups of branch lines BL4-9 and BL4-10 share branch lines VDDB. Further, the groups of branch lines BL4-6 and BL4-7, the groups of branch lines BL4-8 and BL4-9, and the groups of branch lines BL4-10 and BL4-11 share branch lines VSSB4.

For this reason, in comparison with the case where the branch lines are separately provided, the circuit area can be reduced.

Other than this, the same effects can be exhibited by the same configuration as the semiconductor integrated circuit according to the first embodiment.

Fifth Embodiment

Next, a fifth embodiment of the present invention will be explained.

The semiconductor integrated circuit according to the fifth embodiment is obtained by changing the branch lines formed in the same interconnect line layer side by side (first branch lines and second branch lines) in the semiconductor integrated circuit according to the fourth embodiment to branch lines formed in different interconnect line layers facing each other. The overall configuration, such as the arrangement of the groups of power lines, is the same as that of the semiconductor integrated circuit according to the first embodiment.

Figure 14:
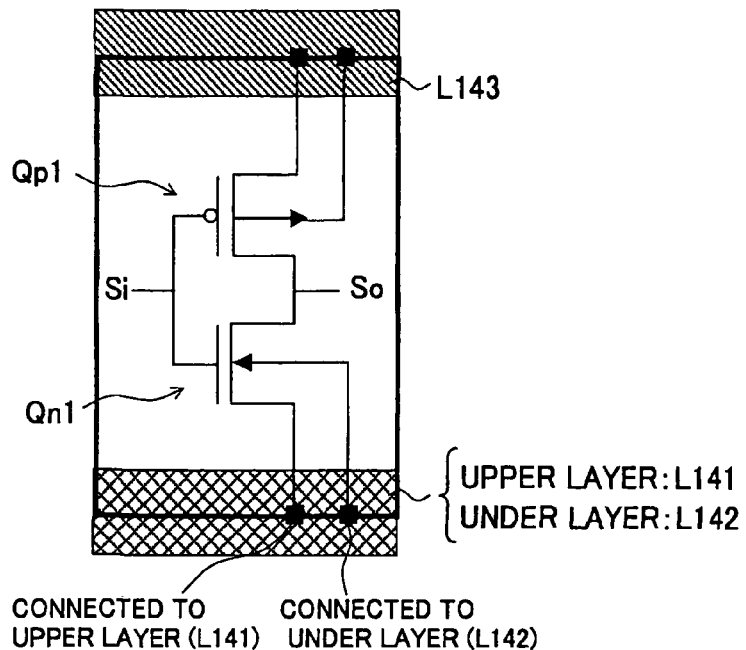
FIG. 14 is a view of an example of the configuration of a power cutoff type circuit cell according to a fifth embodiment.

FIG. 14 is a view of an example of the configuration of a circuit cell 14 according to the fifth embodiment of the present invention. The circuit cell 14 shown in FIG. 14 has an inverter circuit configured as a serial circuit of a p-type MOS transistor Qp1 and a n-type MOS transistor Qn1 and has interconnect lines L141 to L143 supplying power to this inverter circuit. Note that FIG. 14 shows an inverter circuit cell as an example, but the circuit cells 14 explained in the present embodiment also may include various circuit cells used as basic circuits, for example, NAND circuit cells.

The inverter circuit (Qp1, Qn1) is connected between the interconnect lines L141 and L143 and supplied with power from these interconnect lines. Accordingly, when a power switch cell 24 explained later is in the off state, the supply of power to the inverter circuit is cut off. Note that, in the example of FIG. 14, the substrate of the p-type MOS transistor Qp1 is connected to the interconnect line L143, and the substrate of the n-type MOS transistor Qn1 is connected to the interconnect line L142. As will be explained later, the interconnect lines L142 and L143 are constantly connected to the power lines VSS and VDD, and therefore, regardless of cutoff or non-cutoff of power, the substrate potentials of these MOS transistors can be held stably.

The interconnect line L141 is connected to a branch line VSSB5 supplying the power potential VSS to the circuit cell 14. The interconnect line L141 has the same potential as that of the power line VSS when a power switch cell 24 explained later is in the on state.

The interconnect line L142 is connected to a branch line VSSB6 in the layer below the branch line VSSB5. The branch line VSSB6 is an interconnect line branching from the power line VSS. The interconnect line L142 has the same potential as that of the power line VSS.

The interconnect line L143 is connected to the branch line VDDB branching from the power line VDD. The interconnect line L143 has the same potential as that of the power line VDD.

The interconnect lines L142 and L143 are formed at opposite side portions of the rectangular circuit cell 12. The interconnect line L141 is formed in a layer above the interconnect line L142 so as to face the interconnect line L142. The inverter circuit is arranged in the area between the interconnect line L143 and the interconnect line L142.

Figure 15:
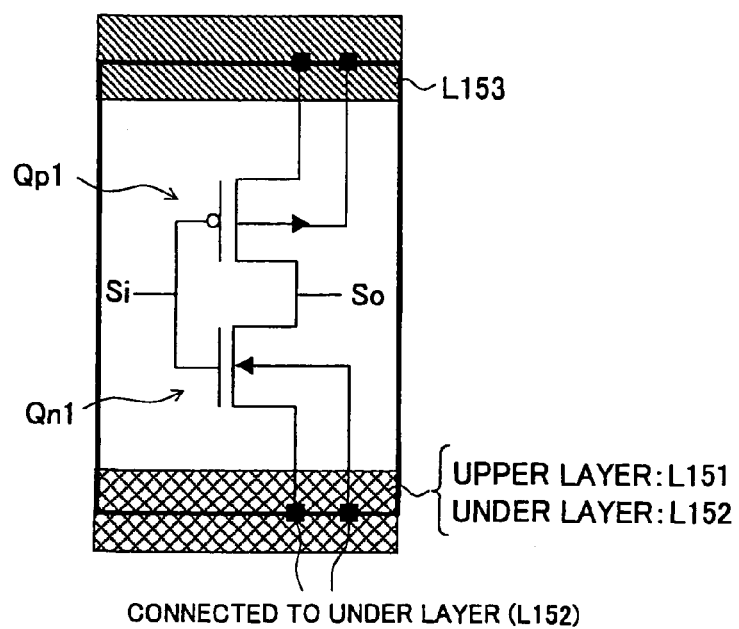
FIG. 15 is a view of an example of the configuration of a constantly powered circuit cell according to the fifth embodiment.

FIG. 15 is a view of an example of the configuration of the circuit cell 15 according to the present embodiment. The circuit cell 15 shown in FIG. 15 has an inverter circuit configured as a serial circuit of a p-type MOS transistor Qp1 and a n-type MOS transistor Qn1 and has interconnect lines L151 to L153 supplying power to this inverter circuit.

Interconnect lines L151, L152, and L153 in the circuit cell 15 correspond to the interconnect lines L141, L142, and L143 in the circuit cell 14 explained above. The structures of the two and the branch lines to which they are connected are the same.

The difference of the circuit cell 14 and the circuit cell 15 resides in the interconnect lines supplying power to the inverter circuit (Qp1, Qn1). Namely, the circuit cell 14 is supplied with power from the interconnect lines L141 and L143, therefore the supply of power is cut off when the power switch cell 24 is off, but the circuit cell 15 is supplied with power from the interconnect lines L152 and L153, so power is always supplied regardless of the state of the power switch cell 24.

Figure 16:
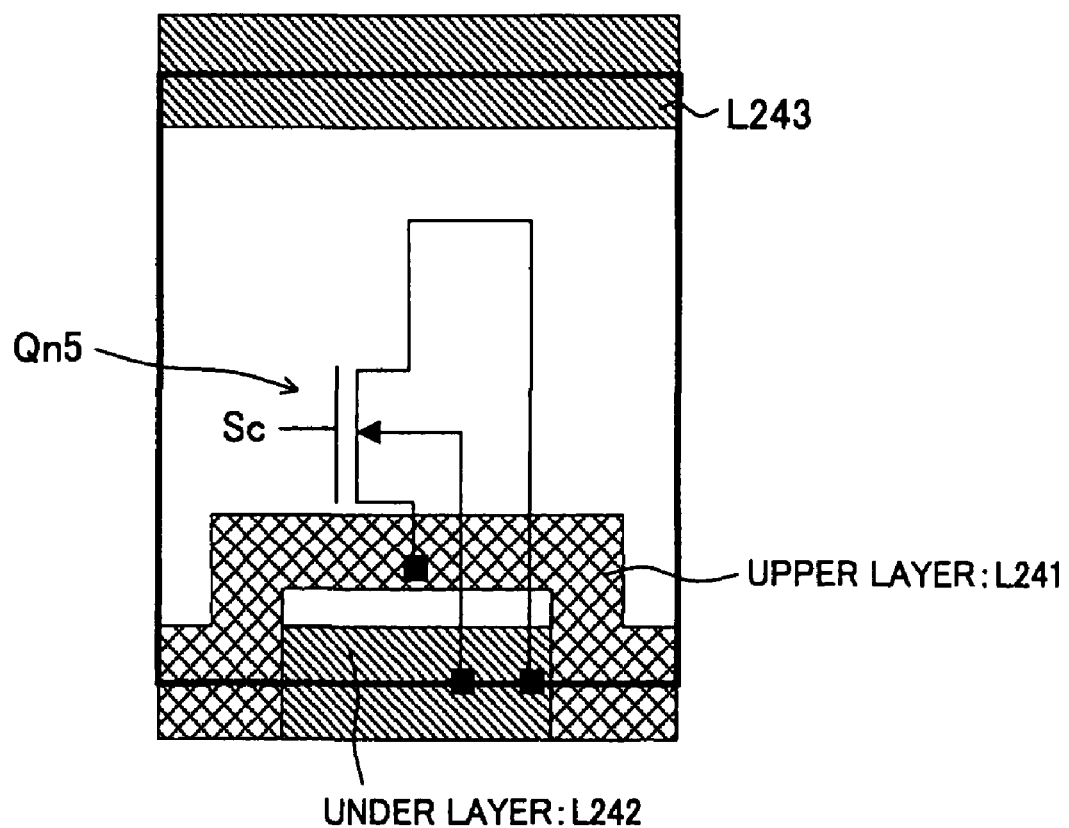
FIG. 16 is a view of an example of the configuration of a power switch cell according to the fifth embodiment.

FIG. 16 is a view of an example of the configuration of the power switch cell 24 according to the present embodiment. The power switch cell 24 has a n-type MOS transistor Qn5 and interconnect lines L241 to L243. The n-type MOS transistor Qn5 is an embodiment of the switch circuit of the present invention, the interconnect line L241 is an embodiment of the fifth interconnect line of the present invention, and the interconnect line L242 is an embodiment of the sixth interconnect line of the present invention.

The interconnect line L241 is connected to the branch line VSSB5 supplying the potential VSS to the circuit cell 14. The interconnect line L241 has the same potential as that of the power line VSS when the n-type MOS transistor Qn5 is on.

The interconnect line L242 is connected to the branch line VSSB6 branching from the power line VSS. The interconnect line L242 has the same potential as that of the power line VSS.

The interconnect line L243 is connected to the branch line VDDB branching from the power line VDD. The interconnect line L243 has the same potential as that of the power line VDD.

The n-type MOS transistor Qn5 has a drain that is connected to the interconnect line L241, a source and a substrate that are connected to the interconnect line L242, and a gate that receives as input a control signal Sc. The n-type MOS transistor Qn5 turns on or off in accordance with the control signal Sc. When the n-type MOS transistor Qn5 turns on, the interconnect line L241 and the interconnect line L242 are connected, and power is supplied to the circuit cell 14 connected to the branch line VSSB5. When the n-type MOS transistor Qn5 turns off, the interconnect line L241 and the interconnect line L242 are disconnected, and the supply of power to the circuit cell 14 is cut off.

The interconnect lines L242 and L243 are formed at opposite side portions of the rectangular power switch cell 24. The interconnect line L241 is formed in an interconnect line layer above the interconnect line L242 so as to face the interconnect line L242. Note that at the center portion of the side, the interconnect line L242 is sunken in an U-shape toward the inside of the power switch cell 24. In this recess, via interconnect lines CT8 (refer to FIG. 17) connecting the interconnect line L242 and the power line VSS are arranged. The n-type MOS transistor Qn5 is arranged in the area between the interconnect line L241 and the interconnect line L243.

Figure 17:
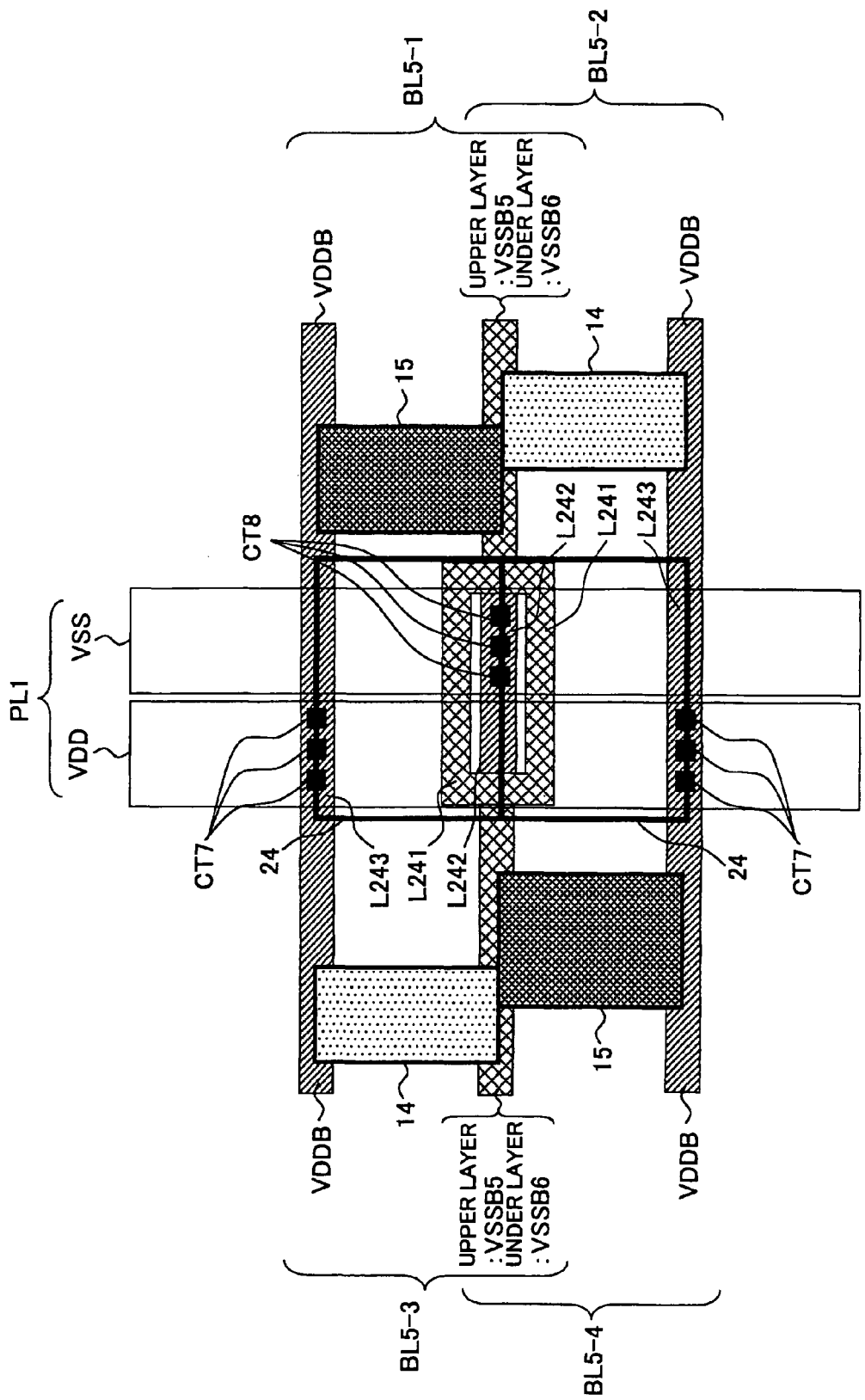
FIG. 17 is a view of an example of the layout of a semiconductor integrated circuit according to the fifth embodiment.

FIG. 17 is a view of an example of the layout of the semiconductor integrated circuit according to the present embodiment. In the example of FIG. 17, groups of branch lines BL5-1 to BL5-4 branch from the group of power lines PL1. The respective groups of branch lines BL5-1 to BL5-4 have branch lines VDDB, VSSB5, and VSSB6. Note that the branch line VSSB5 is not directly connected to the power line VSS, but is connected to the power line VSS through the branch line VSSB6 when the power switch cell 24 is on. Further, these branch lines extend in directions perpendicular to the group of power lines PL1.

The groups of branch lines BL5-1 and BL5-2 are adjacent to each other and share the branch lines VSSB5 and VSSB6. The groups of branch lines BL5-3 and BL5-4 are adjacent to each other and share the branch lines VSSB5 and VSSB6.

The groups of branch lines BL5-1 and BL5-3 branch from a common branch point of the group of power lines PL1 and extend in opposite directions to each other across a common power switch cell 24. The groups of branch lines BL5-2 and BL5-4 branch from a common branch point of the group of power lines PL1 and extend in opposite directions to each other across a common power switch cell 24.

Further, at least parts of both of the power switch cell 24 connected to the groups of branch lines BL5-1 and BL5-3 and the power switch cell 24 connected to the groups of branch lines BL5-2 and BL5-4 are included in an area under the group of power lines PL1.

The interconnect line branching from the power line VSS to the interconnect line L242 includes via interconnect lines CT8 branching from the power line VSS and extending to the lower layer. The via interconnect lines CT8 connect the power line VSS and the interconnect line L242 in the lower layer. The interconnect line branching from the power line VDD to the interconnect line L243 includes via interconnect lines CT7 branching from the power line VDD and extending to the lower layer. The via interconnect lines CT7 connect the power line VDD and the interconnect line L243 in the lower layer.

Further, these two power switch cells 24 are adjacent to each other and are electrically connected to the interconnect line L241, so they function as two parallel connected switches. Accordingly, the n-type MOS transistors Qns5 of these two power switch cells 24 are controlled so as to turn on or off together by the same control signal Sc.

As explained above, according to the present embodiment, the branch lines VSSB5 and VSSB6 are formed facing each other with a space between layers, and therefore the circuit area can be reduced in comparison with the case where they are formed in the same interconnect line layer.

Further, the power switch cells 24 are arranged so that at least parts thereof are included in the area under the group of power lines PL1, so the density of arrangement of the circuit cells 14 and 15 can be improved.

Further, in the example of FIG. 17, a structure where two power switch cells 24 connected in parallel is exhibited, and therefore operation is possible even the reduced to one power switch cell 24. Namely, it is also possible to control the supply of power of four groups of branch lines by one power switch cell 24.

Other than this, the same effect can be exhibited by the same configuration as that of the semiconductor integrated circuit according to the fourth embodiment.

Sixth Embodiment

Next, a sixth embodiment of the present invention will be explained.

The switch transistor used in the power switch cell desirably has a drive capability as large as possible in order to reduce the drop of the power supply voltage, but when this is made too large, the disadvantages of an increase of the circuit area and leakage current are induced.

Therefore, in the semiconductor integrated circuit according to the present embodiment, the drive capabilities of the switch transistors are set in accordance with the power consumption of the circuit cells turned on/off in supply of power according to this switch transistor. For example, the larger power consumption the circuit cells have, the larger drive capabilities the switch transistors controlling the supply of power to the circuit cells have.

Namely, in the semiconductor integrated circuit according to the second embodiment, the drive capability of the n-type MOS transistor Qn2 is set according to the power consumption of the circuit cell 11 connected to the drain of the n-type MOS transistor Qn2 through the interconnect line L211 of the power switch cell 21 and the branch line VSSB.

In the semiconductor integrated circuit according to the third embodiment, the drive capability of the n-type MOS transistor Qn3 is set according to the power consumption of the circuit cell 11 connected to the drain of the n-type MOS transistor Qn3 through the interconnect line L221 of the power switch cell 22 and the branch line VSSB1.

In the semiconductor integrated circuit according to the fourth embodiment, the drive capability of this n-type MOS transistor Qn4 is set according to the power consumption of the circuit cell 12 connected to the drain of the n-type MOS transistor Qn4 through the interconnect line L231 of the power switch cell 23 and the branch line VSSB3.

In the semiconductor integrated circuit according to the fifth embodiment, the drive capability of this n-type MOS transistor Qn5 is set according to the power consumption of the circuit cell 14 connected to the drain of the n-type MOS transistor Qn5 through the interconnect line L241 of the power switch cell 24 and the branch line VSSB5.

Figure 18:
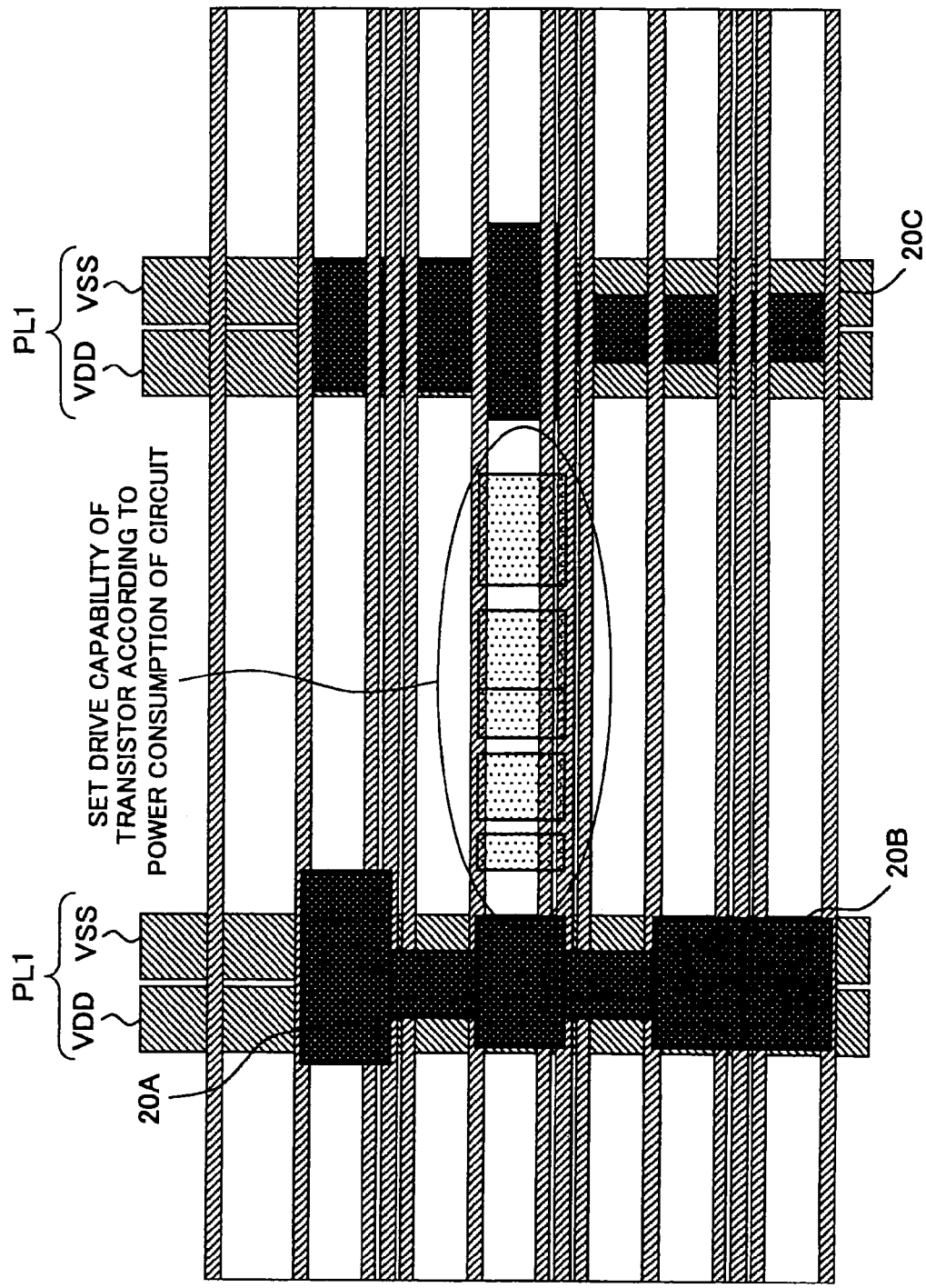
FIG. 18 is a view of an example of a plurality of power switch cells having different drive capabilities according to a sixth embodiment.

FIG. 18 is a view of an example of power switch cells 20A to 20C according to the sixth embodiment of the present invention. In the example of FIG. 18, three types of power switch cells (20A to 20C) having different drive capabilities of the switch transistors are selectively used according to the magnitudes of the power consumptions of the circuit cells when power is supplied. Namely, the power switch cell 20A having the maximum drive capability is used for the circuit having the largest power consumption, the power switch cell 20B having the intermediate drive capability is used for the circuit having the medium power consumption, and the power switch cell 20C having the minimum drive capability is used for the circuit having the smallest power consumption.

By setting the drive capabilities of the switch transistors at the suitable magnitudes according to the power consumptions of the circuit cells supplied with power via the switch transistors in this way, in comparison with the case where the drive capabilities of the switch transistors are uniformly set, the circuit area and the leakage current can be reduced while suppressing the drop of the power supply voltage.

While several preferred embodiments of the present invention were explained above, the present invention is not limited to only these embodiments.

Figure 19:
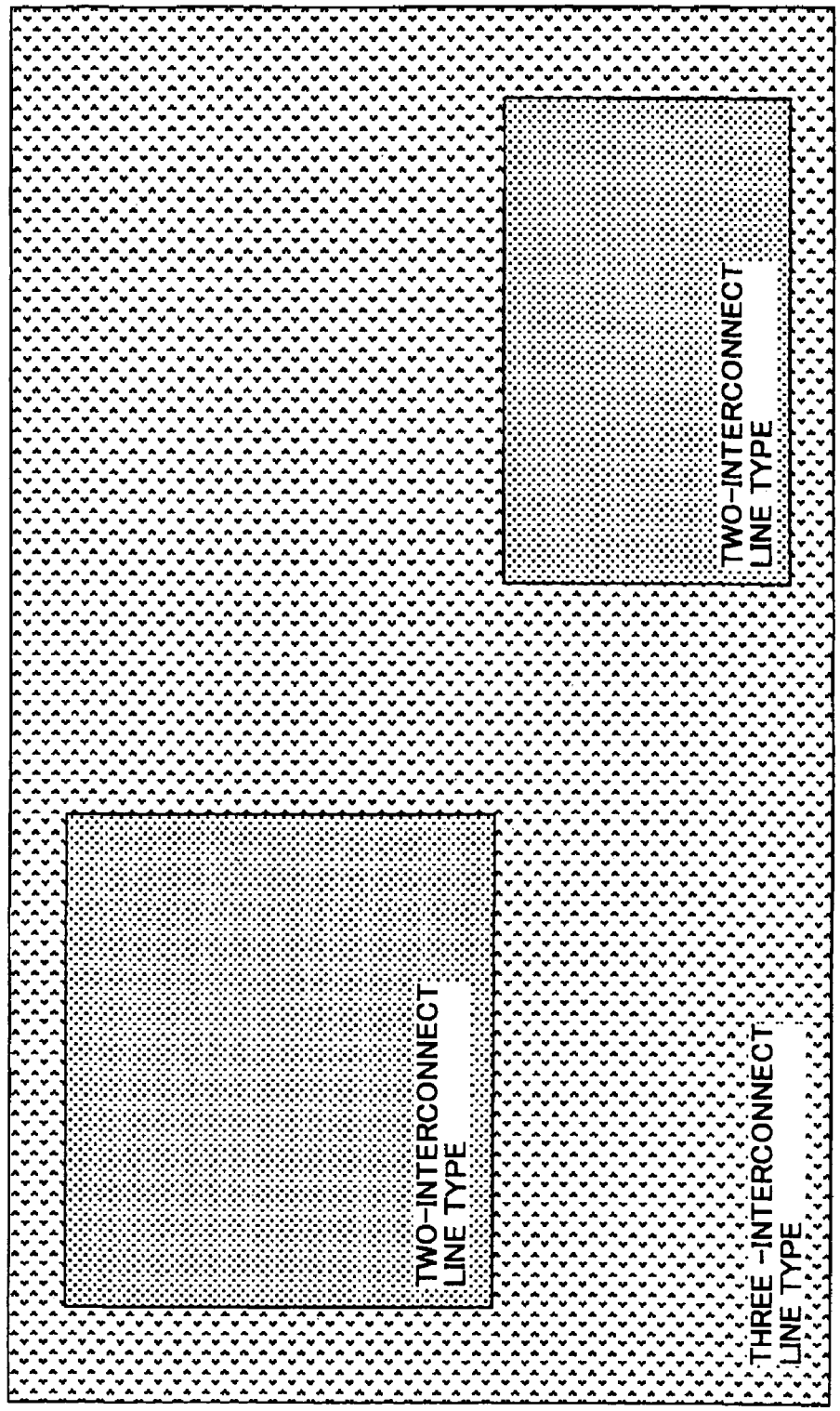
FIG. 19 is a first view of an example of combining a two-interconnect line type structure and a three-interconnect line type structure.
Figure 20:
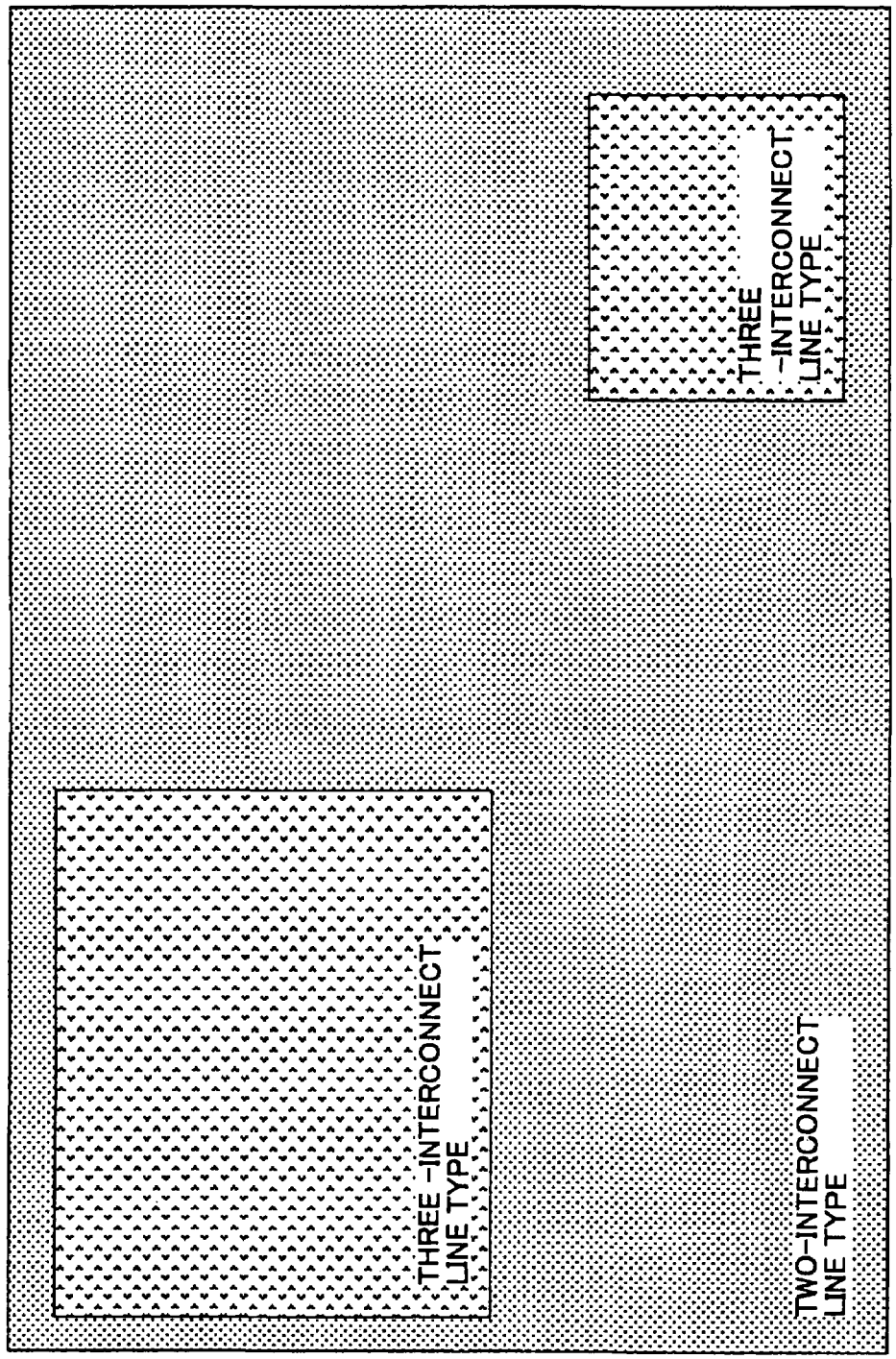
FIG. 20 is a second view of an example of combining a two-interconnect line type structure and a three-interconnect line type structure.

For example, it is also possible to use a two-interconnect line type power structure in the second and third embodiments and a three-interconnect line type structure in the fourth and fifth embodiments in combination in a single semiconductor integrated circuit. FIG. 19 and FIG. 20 are views of an example of the combination of a two-interconnect line type structure and a three-interconnect line type structure. As described above, by combining a variety of interconnect line structures, the degree of freedom of the design is improved, and therefore it becomes possible to select a more suitable interconnect line structure in accordance with the circuit to be designed.

Further, in the above embodiments, the number of power lines included in the group of power lines is two, but the present invention is not limited to this and may include three or more power lines.

Further, in the above embodiments, the example of disconnecting the branch line connected to the power line VSS on the low voltage side by the power switch cell is shown, but the present invention is not limited to this. It is also possible to disconnect the branch line connected to the power line VDD on the high voltage side by the power switch cell or disconnect both of them by the power switch cell.

Further, in the above embodiments, in the lattice stripe shaped power line patterns, the branch lines branch from only vertical stripe shaped power lines, but the present invention is not limited to this and may include also an area where the branch lines branch from horizontal stripe shaped power lines.

It should be understood by those skilled in the art that various modification, combinations, sub-combinations and alterations may occur depending on design requirements and other factors insofar as they are within the scope of the appended claims or the equivalents thereof.

The invention claimed is:

1. A semiconductor integrated circuit comprising:
   a first branch line adapted to provide a potential to a first circuit cell, a power line being at said potential;
   a second branch line adapted to provide said potential to a second circuit cell;
   a third branch line adapted to provide another potential to said first and second circuit cells, another power line being at said another potential,
   wherein an electrical connection between said first and second branch lines is controlled in accordance with a state of a control signal.

2. A semiconductor integrated circuit as set forth in claim 1, wherein said first circuit cell and said second circuit cell can be arranged mixed at any positions on said first and second branch lines.

3. A semiconductor integrated circuit as set forth in claim 1, wherein said potential is VSS.

4. A semiconductor integrated circuit as set forth in claim 1, wherein an interconnection between said power line and said second branch line is present regardless of said state of the control signal.

5. A semiconductor integrated circuit as set forth in claim 1, wherein said another potential is VDD.

6. A semiconductor integrated circuit as set forth in claim 1, wherein said third branch line connects said another power line to said first regardless of said state of the control signal.

7. A semiconductor integrated circuit as set forth in claim 1, further comprising:
   a power switch cell adapted to control said electrical connection between said first and second branch lines.

8. A semiconductor integrated circuit as set forth in claim 7, wherein said power switch cell comprises:
   a first interconnect line connected to said first branch line;
   a second interconnect line connected to said second branch line; and
   a switch circuit between said first interconnect line and said second interconnect line connecting said first interconnect line to said second interconnect line in accordance with said state of the control signal.

* * * * *